US012260817B2

(12) United States Patent
Lee

(10) Patent No.: US 12,260,817 B2
(45) Date of Patent: Mar. 25, 2025

(54) DISPLAY DEVICE AND A DRIVING METHOD THEREOF

(71) Applicant: SAMSUNG DISPLAY CO., LTD., Yongin-si (KR)

(72) Inventor: Gi Chang Lee, Asan-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 18/077,457

(22) Filed: Dec. 8, 2022

(65) Prior Publication Data

US 2023/0095771 A1   Mar. 30, 2023

Related U.S. Application Data

(62) Division of application No. 16/705,535, filed on Dec. 6, 2019, now Pat. No. 11,562,692.

(30) Foreign Application Priority Data

Jan. 25, 2019   (KR) .................. 10-2019-0010053

(51) Int. Cl.
  *G09G 3/3233*  (2016.01)
  *H10K 59/131*  (2023.01)
  *H10K 59/122*  (2023.01)

(52) U.S. Cl.
  CPC ... *G09G 3/3233* (2013.01); *G09G 2300/0417* (2013.01); *G09G 2300/0426* (2013.01);

(Continued)

(58) Field of Classification Search
  CPC .. G09G 3/3225; G09G 3/3233; G09G 3/3266; G09G 2300/0417;

(Continued)

(56) References Cited

U.S. PATENT DOCUMENTS 8,237,634 B2   8/2012   Kwak
8,405,583 B2   3/2013   Ebisuno (Continued)

FOREIGN PATENT DOCUMENTS

CN   101630481 A   1/2010
CN   102074186 A   5/2011

(Continued)

*Primary Examiner* — Julie Anne Watko
(74) *Attorney, Agent, or Firm* — F. CHAU & ASSOCIATES, LLC

(57) ABSTRACT

A display device including: first and second scan drivers; a data driver; a display unit including pixels connected to first and second scan lines, and data lines; and a controller controlling the first and second scan drivers, and the data driver, a first pixel includes: a light emitting element, a first transistor including a gate connected to a first node, wherein the first transistor is connected between a second node and a third node, a second transistor including a gate connected to a first scan line, the second transistor is connected between a data line and the second node, and a storage capacitor connected between the first node and a first power voltage; the first transistor is reverse biased by a second scan signal applied to a second scan line; and a first scan signal applied to the first scan line is different from the second scan signal.

7 Claims, 13 Drawing Sheets

(52) U.S. Cl.
CPC .......... *G09G 2300/043* (2013.01); *G09G 2300/0819* (2013.01); *G09G 2300/0842* (2013.01); *G09G 2300/0861* (2013.01); *G09G 2310/0262* (2013.01); *G09G 2310/08* (2013.01); *G09G 2320/0233* (2013.01); *G09G 2320/0257* (2013.01); *G09G 2320/045* (2013.01); *H10K 59/122* (2023.02); *H10K 59/131* (2023.02)

(58) Field of Classification Search
CPC ..... G09G 2300/0426; G09G 2300/043; G09G 2300/0819; G09G 2300/0842; G09G 2300/0861; G09G 2310/0262; G09G 2310/0264; G09G 2320/0233; G09G 2320/0238; G09G 2320/0257; G09G 2310/08; G09G 2320/045; H10K 59/122; H10K 59/131
See application file for complete search history.

(56) References Cited

U.S. PATENT DOCUMENTS

| | | | |
|---|---|---|---|
| 8,803,770 | B2 | 8/2014 | Jeong et al. |
| 9,105,589 | B2 | 8/2015 | Bang |
| 9,634,070 | B2 | 4/2017 | Shin |
| 10,050,097 | B2 | 8/2018 | Oh et al. |
| 2010/0220118 | A1 | 9/2010 | Kanegae et al. |
| 2011/0122324 | A1 | 5/2011 | Yamashita et al. |
| 2011/0273419 | A1 | 11/2011 | Park et al. |
| 2012/0169707 | A1* | 7/2012 | Ebisuno ............... G09G 3/3233 345/212 |
| 2017/0352313 | A1 | 12/2017 | Miyake |
| 2018/0075808 | A1 | 3/2018 | Yamashita et al. |
| 2018/0145123 | A1* | 5/2018 | Kim ....................... H01L 27/124 |
| 2019/0088200 | A1* | 3/2019 | Woo ..................... H10K 59/353 |
| 2019/0096330 | A1 | 3/2019 | Kim et al. |
| 2020/0243017 | A1 | 7/2020 | Lee |
| 2020/0258452 | A1 | 8/2020 | Feng et al. |

FOREIGN PATENT DOCUMENTS

| | | |
|---|---|---|
| CN | 102314829 A | 1/2012 |
| CN | 102405492 A | 4/2012 |
| CN | 102439652 A | 5/2012 |
| CN | 104867446 A | 8/2015 |
| CN | 108682392 A | 10/2018 |
| KR | 10-2013-0008658 A | 1/2013 |
| KR | 10-2015-0071319 A | 6/2015 |
| KR | 10-2015-0101028 | 9/2015 |
| KR | 10-2017-0049705 | 5/2017 |
| KR | 10-2017-0081030 | 7/2017 |
| KR | 10-2017-0081036 | 7/2017 |
| KR | 10-2017-0122432 | 11/2017 |
| KR | 10-2018-0072440 | 6/2018 |

* cited by examiner

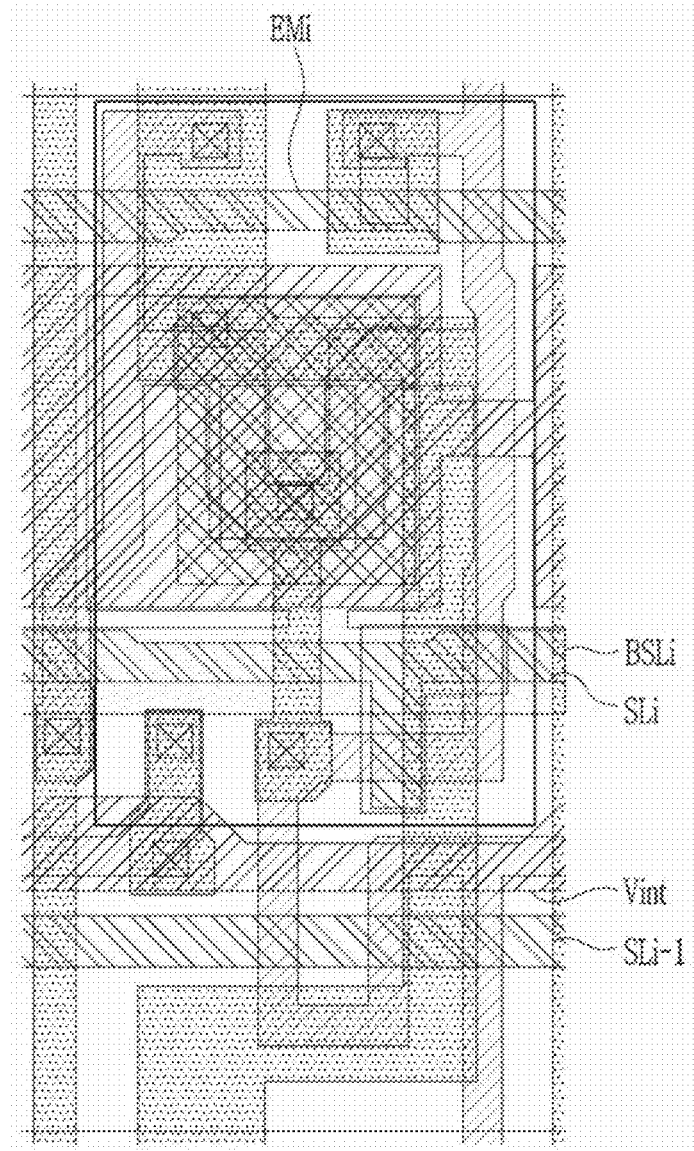

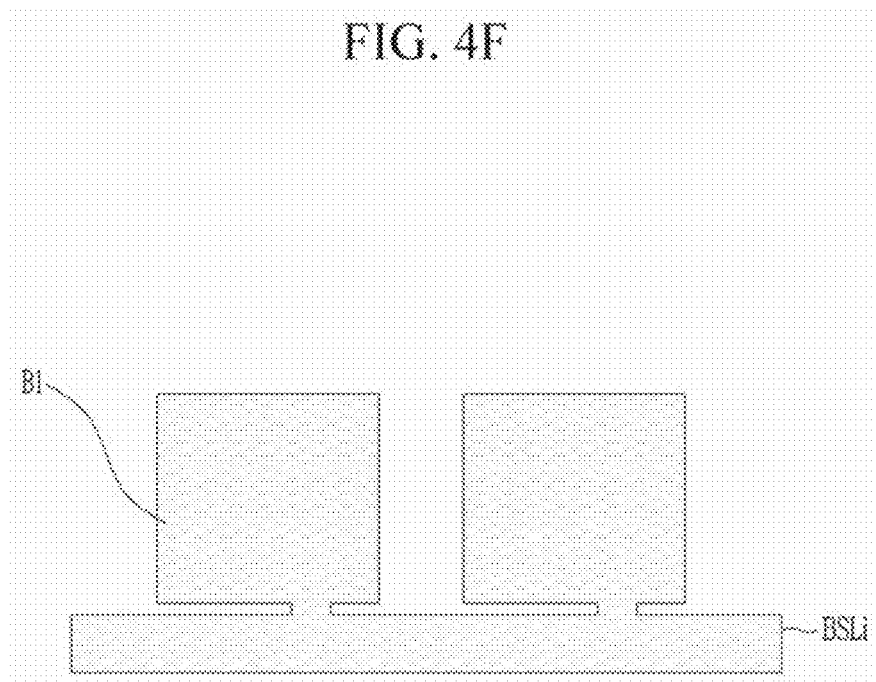

DISPLAY DEVICE AND A DRIVING METHOD THEREOF

CROSS-REFERENCE TO RELATED APPLICATIONS

This application is a divisional application of U.S. patent application Ser. No. 16/705,535 filed on Dec. 6, 2019, which claims priority under 35 U.S.C. § 119 to Korean Patent Application No. 10-2019-0010053 filed in the Korean Intellectual Property Office on Jan. 25, 2019, the disclosures of which are incorporated by reference herein in their entireties.

(a) TECHNICAL FIELD

The present invention relates to a display device and a driving method thereof.

(b) DESCRIPTION OF THE RELATED ART

A display device is an output device for presentation of information in visual form. in general, examples of a display device include a liquid crystal display (LCD), an organic light emitting display (OLED), and a plasma display panel (PDP). Particularly, the OLED is a display device with a self-emission characteristic, and it has excellent characteristics, compared to the LCD, in regard to a viewing angle, a contrast ratio, a response speed, and power consumption.

The OLED includes a plurality of pixels, and the respective pixels include an organic light emitting element and a pixel circuit for driving the organic light emitting element. On a substrate of the OLED, the pixels are disposed in a display area, and a driving circuit for driving the pixels is disposed in a non-display area.

Since the pixels are disposed with high density in the display area, and the OLED is driven with a high frequency, when a voltage for expressing the same gray to the respective pixels is applied, luminances of light displayed by the organic light emitting elements of the respective pixels may be different from each other.

SUMMARY

An exemplary embodiment of the present invention provides a display device including: a first scan driver for transmitting a plurality of first scan signals to a plurality of first scan lines; a second scan driver for transmitting a plurality of second scan signals to a plurality of second scan lines; a data driver for transmitting a plurality of data signals to a plurality of data lines; a display unit including a plurality of pixels connected to the plurality of first scan lines, the plurality of second scan lines, and the plurality of data lines, wherein the plurality of pixels emit light according to the plurality of data signals; and a controller for controlling the first scan driver, the second scan driver, and the data driver, and generating the plurality of data signals and supplying the plurality of data signals to the data driver, wherein a first pixel of the plurality of pixels includes: an organic light emitting element, a first transistor including a gate connected to a first node, wherein the first transistor is connected between a second node and a third node, a second transistor including a gate connected to a corresponding first scan line of the plurality of first scan lines, wherein the second transistor is connected between a corresponding data line of the plurality of data lines and the second node, and a storage capacitor connected between the first node and a first power voltage; wherein the first transistor is reverse biased by a second scan signal applied to a corresponding second scan line of the plurality of second scan lines; and wherein a first scan signal applied to the corresponding first scan line is different from the second scan signal applied to the corresponding second scan line.

The second scan signal applied to the corresponding second scan line has a disable level before the first scan signal applied to the corresponding first scan line has an enable level.

The first pixel further includes: a third transistor including a gate connected to a previous first scan line of the plurality of first scan lines, wherein the third transistor is connected between the first node and an initialization voltage.

The second scan signal applied to the corresponding second scan line has a disable level before a first scan signal applied to the previous first scan line has an enable level.

The second scan signal applied to the corresponding second scan line is changed to the enable level from the disable level before the first scan signal applied to the previous first scan line has the enable level.

The display device further includes: a light emission driver for transmitting a plurality of emission control signals to a plurality of emission control lines, wherein the first pixel further includes: a fourth transistor including a gate connected to a corresponding emission control line of the plurality of emission control lines, wherein the fourth transistor is connected between the first power voltage and the second node, and a fifth transistor including a gate connected to the corresponding emission control line, wherein the fifth transistor is connected between the third node and a terminal of the organic light emitting element, and the second scan signal applied to the corresponding second scan line is changed to an enable level from a disable level after an emission control. signal applied to the corresponding emission control line is changed to the disable level.

The second scan signal applied to the corresponding second scan line is changed to the enable level after the emission control signal applied to the corresponding emission control line is changed to the disable level, and the second scan signal applied to the corresponding second scan line is changed to the disable level from the enable level before the first scan signal applied to the corresponding first scan line has the enable level.

The second scan signal applied to the corresponding second scan line is changed to the enable level from the disable level before the first scan signal applied to the corresponding first scan line has the enable level.

The second scan signal applied to the corresponding second scan line is changed to the disable level from the enable level after the emission control signal applied to the corresponding emission control line is changed to the disable level, and the second scan signal applied to the corresponding second scan line is changed to the enable level before the first scan signal applied to the corresponding first scan line has the enable level.

The first pixel further includes: a sixth transistor including a gate connected to the corresponding first scan line, wherein the sixth transistor is connected between the first node and the third node, and a seventh transistor including a gate connected to the previous first scan line, wherein the seventh transistor is connected between a terminal of the organic light emitting device and the initialization voltage.

An exemplary embodiment of the present invention provides a display device including: a substrate; a plurality of organic light emitting elements provided on the substrate; a plurality of pixel circuits, at least one of the pixel circuits including a first transistor including a first active pattern connected to at least one of the plurality of organic light emitting elements and a first gate electrode disposed on the first active pattern, a second transistor including a second active pattern connected to the first active pattern and a second gate electrode disposed on the second active pattern, and a third transistor including a third active pattern including a third channel connecting the first active pattern and the first gate electrode, wherein the third transistor includes a third gate electrode disposed on the third active pattern; a first scan line disposed on the second active pattern, traversing the plurality of pixel circuits and connected to the second gate electrode and the third gate electrode; a data line disposed on the first scan line, traversing the first scan line and connected to the second active pattern; and a second scan line traversing the plurality of pixel circuits and connected to a first electrode overlapping the first active pattern, wherein the first transistor is reverse biased by a second scan signal applied to the second scan line connected to the first electrode.

The first electrode is disposed between the substrate and the first active pattern.

The second scan line is disposed between the substrate and the first active pattern.

The at least one pixel circuit includes a capacitor electrode overlapping the first gate electrode and forming a capacitor with the first gate electrode, and the first electrode overlaps the capacitor electrode.

The at least one pixel circuit further includes a second electrode connected to the second scan line and overlapping the third channel of the third active pattern.

The at least one pixel circuit further includes: a fourth transistor including a fourth active pattern connected to the first gate electrode and the third active pattern, wherein the fourth transistor includes a fourth gate electrode disposed on the fourth active pattern, and a seventh transistor including a seventh active pattern connected to the fourth active pattern, wherein the seventh transistor includes a seventh gate electrode disposed on the seventh active pattern, wherein the display device further includes: a third scan line disposed on the fourth active pattern and the seventh active pattern, traversing the fourth active pattern and the seventh active pattern and connected to the fourth gate electrode and the seventh gate electrode, a power voltage line disposed on the first scan line, separated from the data line, traversing the first scan line and connected to the first active pattern, and an initialization voltage line disposed on the second scan line and connected to the fourth active pattern and the seventh active pattern.

The at least one pixel circuit further includes: a fifth transistor including a fifth active pattern connecting the first active pattern and the power voltage line, wherein the fifth transistor includes a fifth gate electrode disposed on the fifth active pattern, and a sixth transistor including a sixth active pattern connecting the first active pattern and the organic light emitting element, wherein the sixth transistor includes a sixth gate electrode disposed on the sixth active pattern, wherein the display device further includes: an emission control line disposed on the fifth active pattern and the sixth active pattern, traversing the fifth active pattern and the sixth active pattern and connected to the fifth gate electrode and the sixth gate electrode.

An exemplary embodiment of the present invention provides a method for driving a display device including a plurality of pixels, a first pixel of the plurality of pixels including a first transistor including a gate electrode connected to a first node, and a bias electrode connected to a corresponding second scan line, the first transistor connected between a second node and a third node, a second transistor including a gate electrode connected to a corresponding first scan line, the second transistor connected between a corresponding data line and the second node, a third transistor including a gate electrode connected to a third scan line, the third transistor connected between the first node and an initialization voltage and a storage capacitor connected between the first node and a first power voltage, the method including: applying an enable-level second scan signal to the second scan line a first time; applying a disable-level second scan signal to the second scan line; applying the enable-level second scan signal to the second scan line a second time; applying an enable-level third scan signal to the third scan line; and applying an enable-level first scan signal to the first scan line.

The first pixel further includes a fourth transistor including a gate electrode connected to an emission control line, wherein the fourth transistor is connected between the first power voltage and the second node, and a fifth transistor including a gate electrode connected to the emission control line, wherein the fifth transistor is connected between the third node and an anode of an organic light emitting diode, and the method further includes changing an enable-level emission control signal applied to the emission control line to the disable level before applying the enable-level second scan signal to the second scan line.

The method further includes applying the enable-level emission control signal to the emission control line after applying the enable-level first scan signal to the first scan line.

BRIEF DESCRIPTION OF THE DRAWINGS

FIGS. 4A and 4B shows a layout view of one pixel of a display device according to an exemplary embodiment of the present invention and FIGS. 4C-4E are plan views illustrating layers of the pixel shown in FIGS. 4A and 4B.

DETAILED DESCRIPTION OF THE EMBODIMENTS

Figure 1:
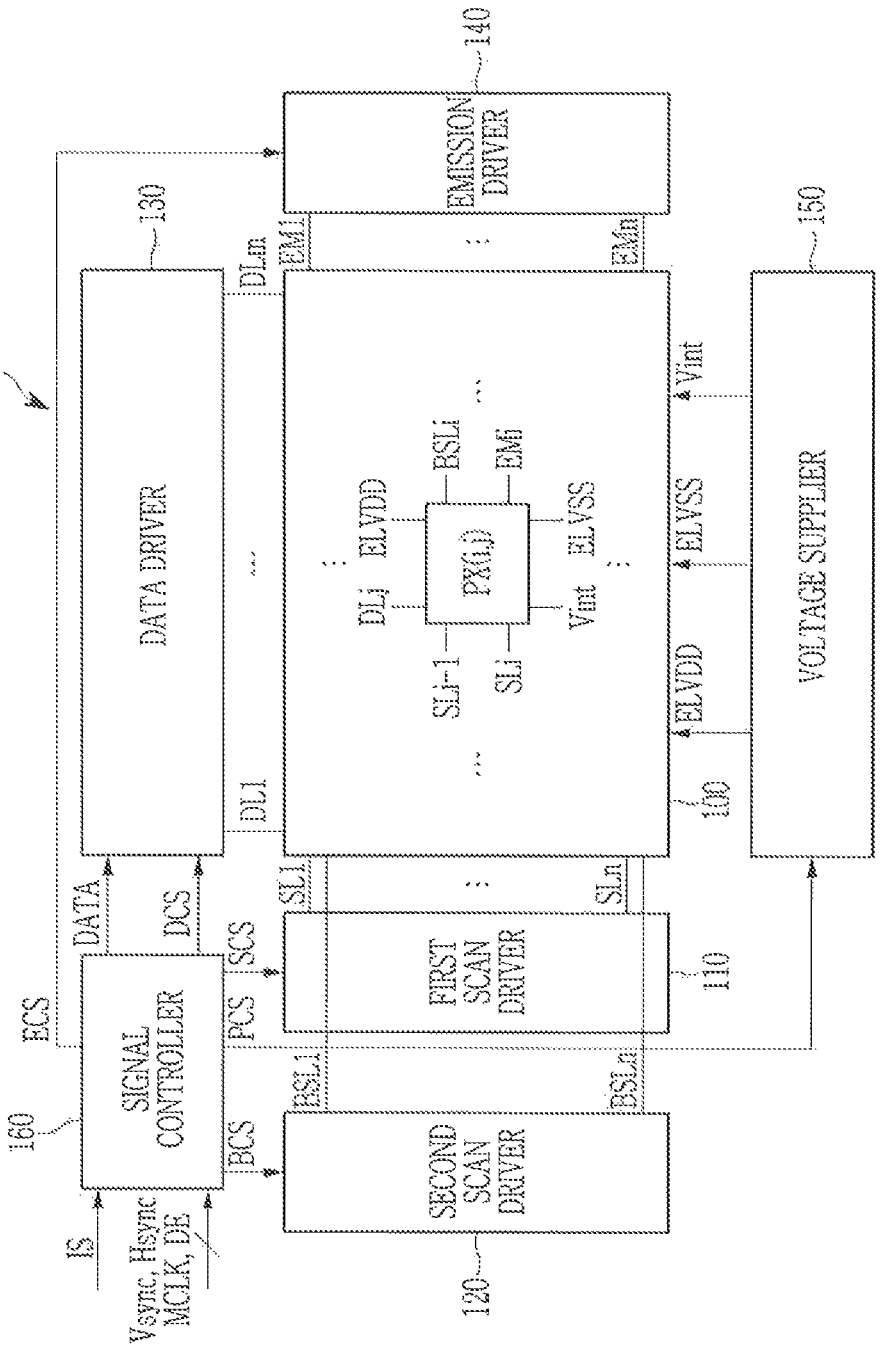
FIG. 1 shows a block diagram of a display device according to exemplary embodiments of the present invention.

Hereinafter, exemplary embodiments of the present invention will be described more fully hereinafter with reference to the accompanying drawings. As those skilled in the art would realize, the described embodiments may be modified in various different ways, and thus, should not be limited to the embodiments set forth herein.

Like reference numerals may designate like elements throughout the specification.

In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present.

The phrase "on a plane" may mean viewing the object portion from the top, and the phrase "on a cross-section" may mean viewing a cross-section formed by vertically cutting the object portion from the side.

FIG. 1 shows a block diagram of a display device 10 according to exemplary embodiments of the present invention.

The display device 10 includes a display unit 100, a first scan driver 110, a second scan driver 120, a data driver 130, a light emission driver 140, a voltage supplier 150, and a signal controller 160. It is to be understood that the display device described in the present specification may include constituent elements that are greater or less in number than the above-noted constituent elements.

The display unit 100 includes a corresponding first scan line from among a plurality of first scan lines SL1 through SLn, a corresponding second scan line from among a plurality of second scan lines BSL1 through BSLn, a corresponding data line from among a plurality of data lines DL1 through DLm, and a pixel PX connected to a corresponding emission control line from among a plurality of emission control lines EM1 through EMn. The display unit 100 may display images when a plurality of pixels PX emit light according to data signals transmitted to the pixels PX.

The plurality of first scan lines SL1 through SLn extend substantially in a row direction and they are substantially parallel to each other. The plurality of second scan lines BSL1 through BSLn extend substantially in the row direction and they are substantially parallel to each other. The plurality of emission control lines EM1 through EMn extend substantially in the row direction and they are substantially parallel to each other. The plurality of data lines DL1 through DLm extend substantially in a column direction and they are substantially parallel to each other.

The plurality of pixels PX receive power voltages ELVDD and ELVSS and an initialization voltage (Vint) from the voltage supplier 150.

The first scan driver 110 is connected to the display unit 100 through the plurality of first scan lines SL1 through SLn. The first scan driver 110 generates a plurality of first scan signals according to a control signal (SCS), and transmits the first scan signal to corresponding first scan lines from among the plurality of first scan lines SL1 through SLn. The control signal (SCS) is an operation control signal of the first scan driver 110 generated and transmitted by the signal controller 160.

The second scan driver 120 is connected to the display unit 100 through the plurality of second scan lines BSL1 through BSLn. The second scan driver 120 generates a plurality of second scan signals according to a control signal (BCS), and transmits the second scan signals to corresponding second scan lines from among the plurality of second scan lines BSL1 through BSLn. The control signal (BCS) is an operation control signal of the second scan driver 120 generated and transmitted by the signal controller 160.

The data driver 130 is connected to the respective pixels PX of the display unit 100 through the plurality of data lines DL1 through DLm. The data driver 130 receives an image data signal (DATA), and transmits a corresponding data signal to a corresponding data line from among the plurality of data lines DL1 through DLm according to a control signal (DCS). The control signal (DCS) is an operation control signal of the data driver 130 generated and transmitted by the signal controller 160.

The data driver 130 selects a gray voltage and transmits the gray voltage to a plurality of data lines as a data signal according to the image data signal (DATA). For example, the data driver 130 samples and holds the image data signal (DATA) input according to the control signal (DCS), and transmits a plurality of data signals to the plurality of data lines DL1 through DLm. The data driver 130 may apply a data signal with a predetermined voltage range to the plurality of data lines DL1 through DLm while a low level first scan signal is applied.

The light emission driver 140 generates a plurality of emission control signals according to a control signal (ECS). The control signal (ECS) may include an emission start signal, emission clock signals that switch to a low level with different timings, and a holding control signal. The emission start signal is a signal for generating a first emission control signal for displaying an image of one frame. The emission clock signals included in the control signal (ECS) are synchronization signals for applying emission control signals to the plurality of emission control lines EM1 through EMn. The holding control signal is a signal for controlling the light emission driver 140 so that the light emission driver 140 may continuously output the emission signal in the case of low frequency driving.

The signal controller 160 receives an image signal (IS) input from the outside and an input control signal for controlling display of the image signal (IS). The image signal (IS) may include luminance information distinguished by grays of the respective pixels PX of the display unit 100.

The input control signal transmitted to the signal controller 160 includes a data vertical synchronization signal Vsync, a horizontal synchronizing signal Hsync, a main clock signal MCLK, and a data enable signal DE.

The signal controller 160 generates control signals SCS, BCS, DCS, ECS, and PCS and an image data signal (DATA) according to the image signal (IS), the horizontal synchronizing signal Hsync, the vertical synchronization signal Vsync, the main clock signal MCLK, and the data enable signal DE.

The signal controller 160 image-processes the image signal (IS) according to an operating condition of the display unit 100 and the data driver 130 based on the input image signal (IS) and the input control signal. For example, the signal controller 160 may generate an image data signal (DATA) by performing image processing, such as gamma correction or luminance compensation, on the image signal (IS).

For example, the signal controller 160 generates a control signal (DCS) for controlling an operation of the data driver 130, and transmits the control signal (DCS) and the image data signal (DATA) having undergone the image processing to the data driver 130. The signal controller 160 transmits a control signal (SCS) for controlling an operation of the first scan driver 110 to the first scan driver 110, and transmits a control signal (BCS) for controlling an operation of the second scan driver 120 to the second scan driver 120. The signal controller 160 may transmit the emission control signal (ECS) to the light emission driver 140 to drive the light emission driver 140.

The signal controller 160 may control driving of the voltage supplier 150. The voltage supplier 150 may supply power voltages ELVDD and ELVSS for driving the pixels PX and an initialization voltage (Vint). For example, the signal controller 160 may transmit the control signal (PCS) to the voltage supplier 150 to drive the voltage supplier 150. The voltage supplier 150 may be connected to a voltage supply line formed on the display unit 100.

A plan view of a display device will now be described with reference to FIG. 2.

Figure 2:
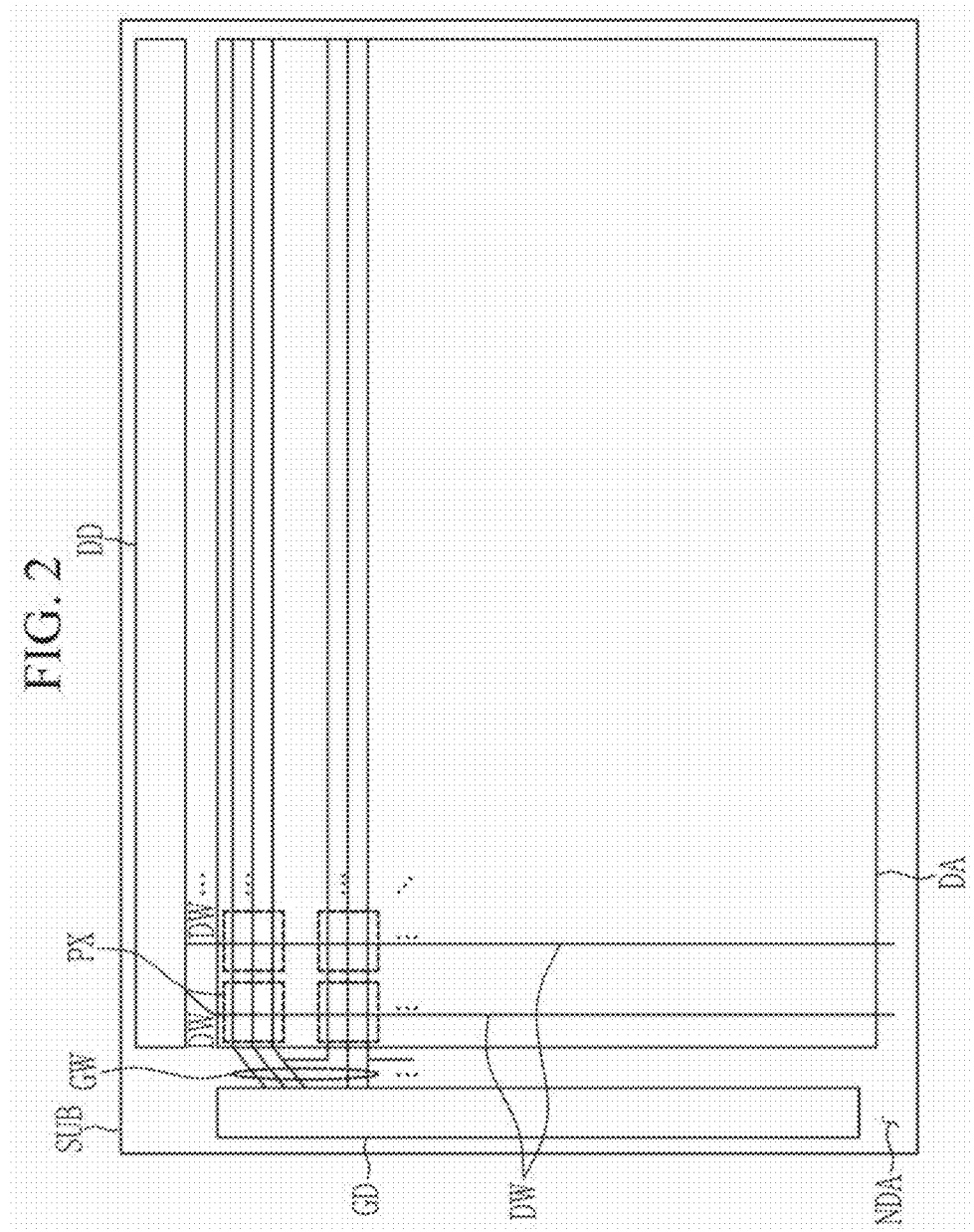
FIG. 2 shows a top plan view of part of a display device of FIG. 1.

FIG. 2 shows a top plan view of part of a display device of FIG. 1.

As shown in FIG. 2, the display device includes a substrate (SUB), a plurality of pixels PX, a plurality of gate wires (GW), a gate driver (GD), a plurality of data wires (DW), and a data driver (DD).

The substrate (SUB) includes a display area (DA) for displaying images, and a non-display area (NDA) provided next to the display area (DA). The non-display area (NDA) may surround an edge of the display area (DA), without being limited thereto. The substrate (SUB) is an insulating substrate including glass, a polymer, or stainless steel. The substrate (SUB) may be flexible, stretchable, foldable, bendable, or rollable. Since the substrate (SUB) is flexible, stretchable, foldable, bendable, or rollable, the display device may be flexible, stretchable, foldable, bendable, or rollable.

The plurality of pixels PX are provided on the substrate (SUB) corresponding to the display area (DA) of the substrate (SUB). The plurality of pixels PX are respectively connected to the plurality of gate wires (GW) and a plurality of data wires (DW). Each of the plurality of pixels PX emits light with a luminance corresponding to a driving current corresponding to a signal supplied by its corresponding data wire (DW). The plurality of pixels PX respectively include a pixel circuit including an organic light emitting element, a plurality of transistors for controlling a driving current flowing to the organic light emitting element, and at least one capacitor.

The plurality of gate wires (GW) are connected to the gate driver (GD) and are connected to the plurality of pixels PX. The plurality of gate wires (GW) may include first scan lines (SL1 through SLn of FIG. 1), second scan lines (BSL1 through BSLn of FIG. 1), an initialization voltage line, and emission control lines (EM1 through EMn of FIG. 1).

The gate wires (GW) including the first scan lines (SL1 through SLn of FIG. 1), the second scan lines (BSL1 through BSLn of FIG. 1), the initialization voltage line, and the emission control lines (EM1 through EMn of FIG. 1) may not be connected to the gate driver (GD), but may be connected to a driver other than the gate driver (GD) through a pad in the substrate (SUB).

The gate driver (GD) is provided in the non-display area (NDA) of the substrate (SUB), and is connected to the plurality of gate wires (GW).

The plurality of data wires (DW) are connected to the data driver (DD) and are connected to the plurality of pixels PX. The plurality of data wires (DW) may include data lines (DL1 through DLm of FIG. 1) and a power voltage line.

The data wires (DW) including the data lines (DLl through DLm of FIG. 1) and the power voltage may not be connected to the data driver (DD), but may be connected to a driver other than the data driver (DD)through a pad of the substrate (SUB).

The data driver (DD) is provided in the non-display area (NDA) of the substrate (SUB), and is connected to the plurality of data wires (DW).

A circuit of one pixel PX of a display device according to exemplary embodiments of the present invention will now be described with reference to FIG. 3.

Figure 3:
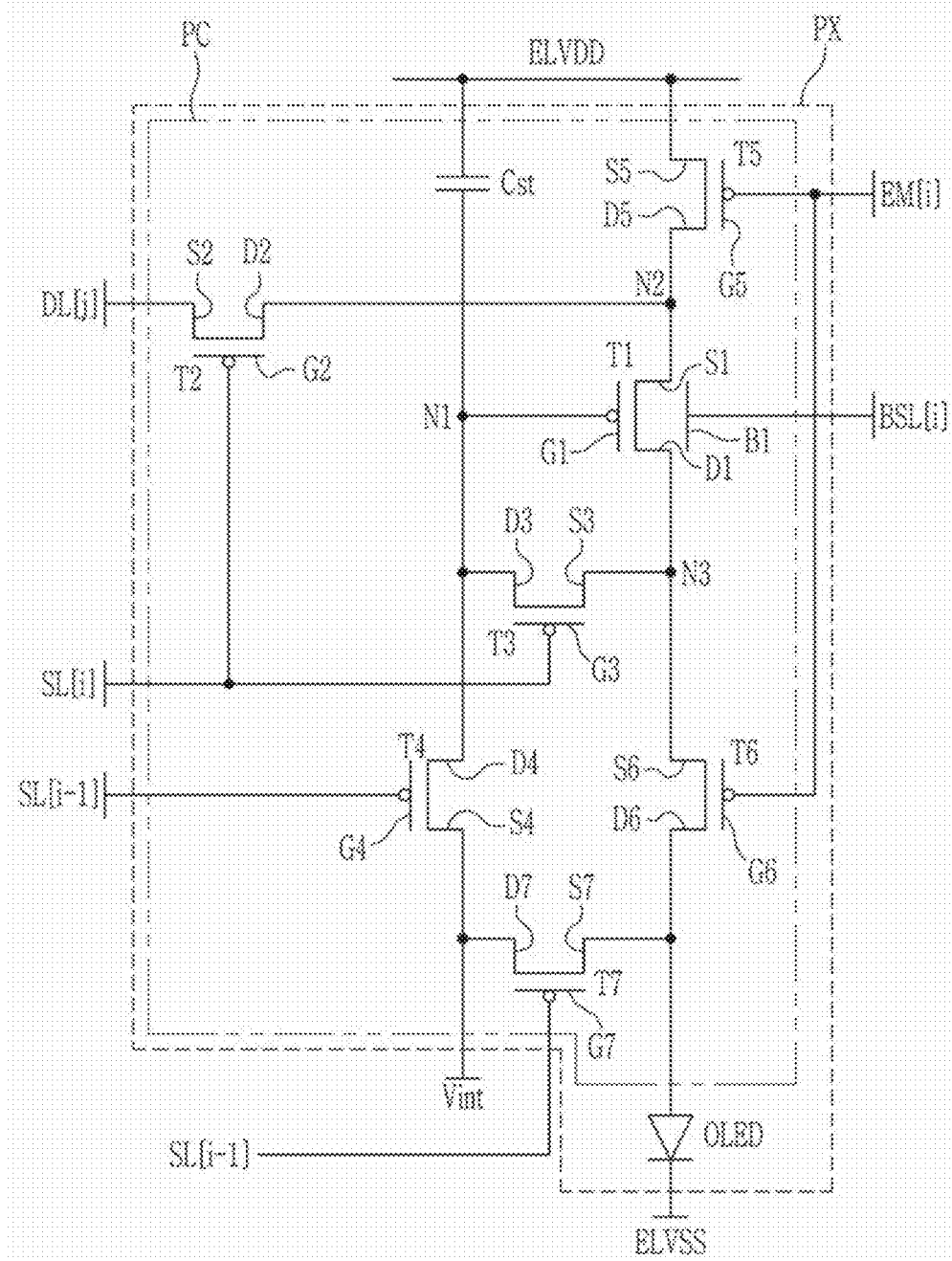
FIG. 3 shows a circuit diagram of a pixel of FIG. 2.

FIG. 3 shows a circuit diagram of a pixel of FIG. 2.

The pixel PX includes a pixel circuit (PC) including a plurality of transistors T1, T2, T3, T4, T5, T6, and T7 and a capacitor Cst selectively connected to the first scan lines SLi-1 and SLi, the second scan line (BSLi), the emission control line (EMi), the initialization voltage line (Vint), the data line (DLj), and the power voltage lines ELVDD and ELVSS, and an organic light emitting element (OLED) connected to the pixel circuit (PC).

Here, the first scan lines SLi-1 and SLi, the second scan line (BSLi), the emission control line (EMi), and the initialization voltage line (Vint) may be included in the above-noted gate wires (GW of FIG. 2), and the data line (DLj) and the power voltage lines ELVDD and ELVSS may be included in the data wires (DW of FIG. 2). The first scan lines SLi-1 and SLi, the second scan line (BSLi), the emission control line (EMi), the initialization voltage line (Vint), the data line (DLj), and the power voltage lines ELVDD and ELVSS may include materials that are the same as each other or different from each other. In addition, the first scan lines SLi-1 and SLi, the second scan line (BSLi), the emission control line (EMi), the initialization voltage line (Vint), the data line (DLj), and the power voltage lines ELVDD and ELVSS may be provided on the same layer or different layers on the substrate (SUB).

At a first node N1, a first gate electrode G1 of the first transistor T1 is connected to a third drain electrode D3 of the third transistor T3, a fourth drain electrode D4 of the fourth transistor T4, and a first electrode of the capacitor Cst. At a second node N2, a first source electrode S1 of the first transistor T1 is connected to a second drain electrode D2 of the second transistor T2 and a fifth drain electrode D5 of the fifth transistor T5. At a third node N3, a first drain electrode D1 of the first transistor T1 is connected to a third source electrode S3 of the third transistor T3 and a sixth source electrode S6 of the sixth transistor T6. The first transistor T1 includes a bias electrode B1 overlapping an active portion of the first transistor T1. The bias electrode B1 is connected to the second scan line (BSLi).

A second gate electrode G2 of the second transistor T2 is connected to the first scan line (SLi), a second source electrode S2 of the second transistor T2 is connected to the data line (DLj), and the second drain electrode D2 of the second transistor T2 is connected to the first source electrode S1 of the first transistor T1 at the second node N2.

A third gate electrode G3 of the third transistor T3 is connected to the first scan line (SLi), the third source electrode S3 of the third transistor T3 is connected to the first drain electrode D1 of the first transistor T1 at the third node N3, and the third drain electrode D3 of the third transistor T3 may be connected to the first gate electrode G1 of the first transistor T1 at the first node N1.

A fourth gate electrode G4 of the fourth transistor T4 is connected to the first scan line (SLi-1), a fourth source electrode S4 of the fourth transistor T1 is connected to the initialization voltage line (Vint), and the fourth drain electrode D4 of the fourth transistor T4 is connected to the first gate electrode G1 of the first transistor T1 at the first node N1.

A fifth gate electrode G5 of the fifth transistor T5 is connected to the emission control line (EMi), a fifth source electrode S5 of the fifth transistor T5 is connected to the power voltage line (ELVDD), and the fifth drain electrode D5 of the fifth transistor T5 is connected to the first source electrode S1 of the first transistor T1 at the second node N2.

A sixth gate electrode G6 of the sixth transistor T6 is connected to the emission control line (EMi), the sixth source electrode S6 of the sixth transistor T6 is connected to the first drain electrode D1 of the first transistor T1 at the third node N3, and a sixth drain electrode D6 of the sixth transistor T6 is connected to a first electrode of the organic light emitting element (OLED). The first transistor T1 is connected to the organic light emitting element (OLED) through the sixth transistor T6.

A seventh gate electrode G7 of the seventh transistor T7 is connected to the first scan line (SLi-1), a seventh source electrode S7 of the seventh transistor T7 is connected to the first electrode of the organic light emitting element (OLED), and a seventh drain electrode D7 of the seventh transistor T7 is connected to the fourth source electrode S4 of the fourth transistor T4 and the initialization voltage line (Vint).

The capacitor Cst includes the first electrode connected to the first gate electrode G1 of the first transistor T1 and the third drain electrode D3 of the third transistor T3 at the first node N1, and a second electrode connected to the power voltage line (ELVDD).

The organic light emitting element (OLED) includes the first electrode, a second electrode provided on the first electrode, and an organic emission layer provided between the first electrode and the second electrode. The organic light emitting element (OLED) includes the first electrode connected to the seventh source electrode S7 of the seventh transistor T7 and the sixth drain electrode D6 of the sixth transistor T6, and a second electrode connected to the power voltage line (ELVSS).

An arrangement of one pixel of a display device according to an exemplary embodiment of the present invention will now be described with reference to FIGS. 4A-4F and FIG. 5.

Insulating layers are provided among elements provided on different layers to be described hereinafter, and the insulating layers may be inorganic insulating layers or organic insulating layers such as a silicon nitride or a silicon oxide. Further, the insulating layers may be formed as a single layer or a multilayer.

Figure 4A:
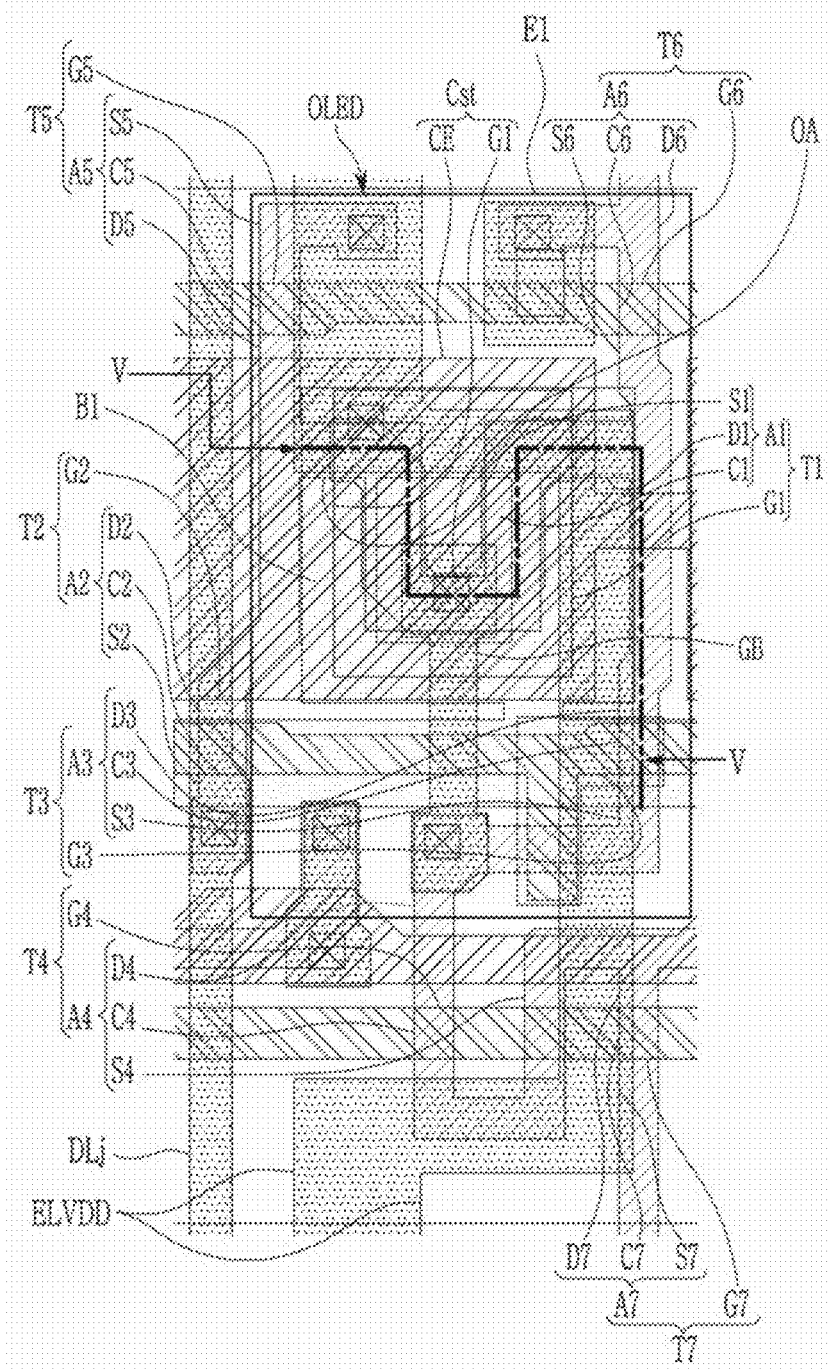
Figure 4C:
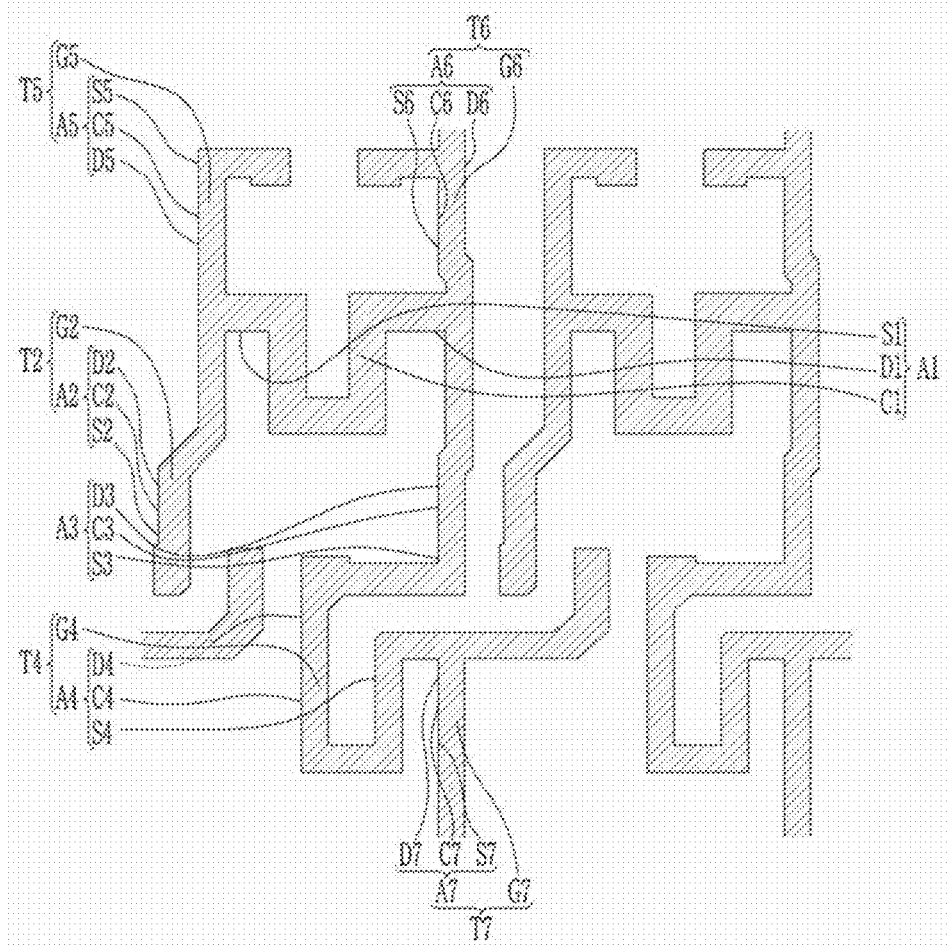
Figure 4D:
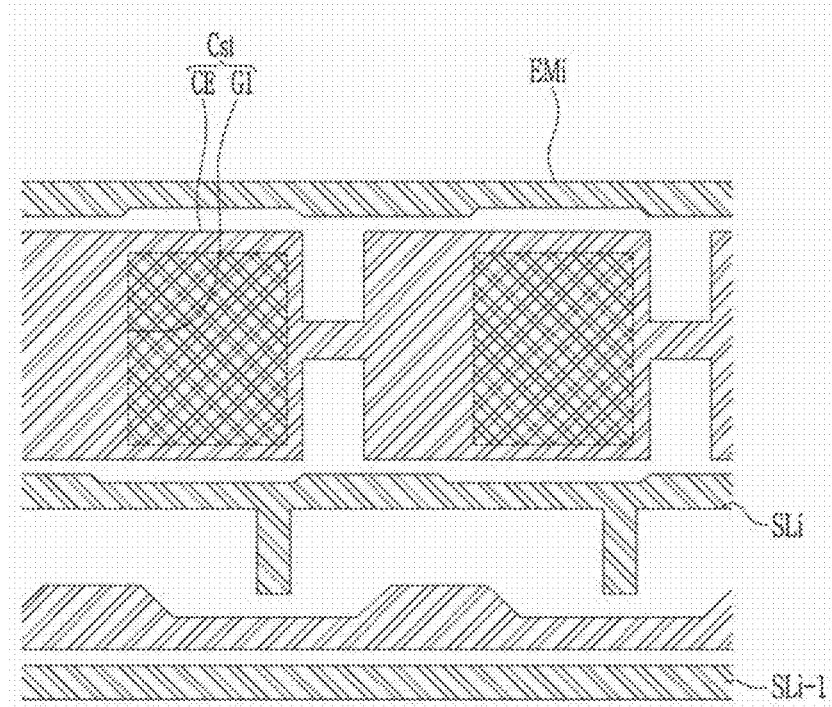
Figure 4E:
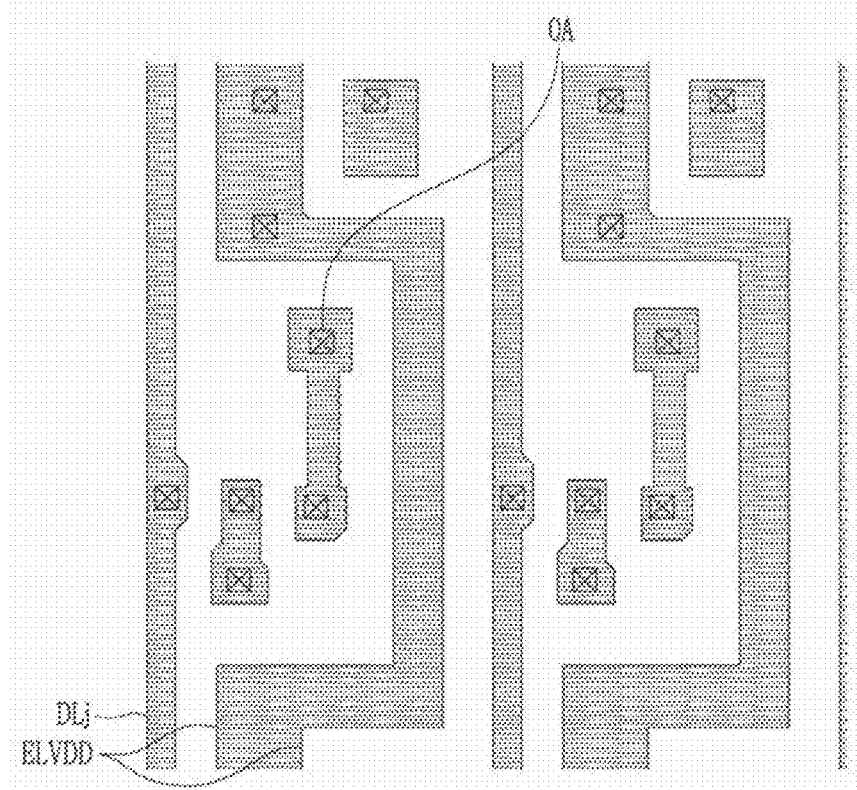
Figure 5:
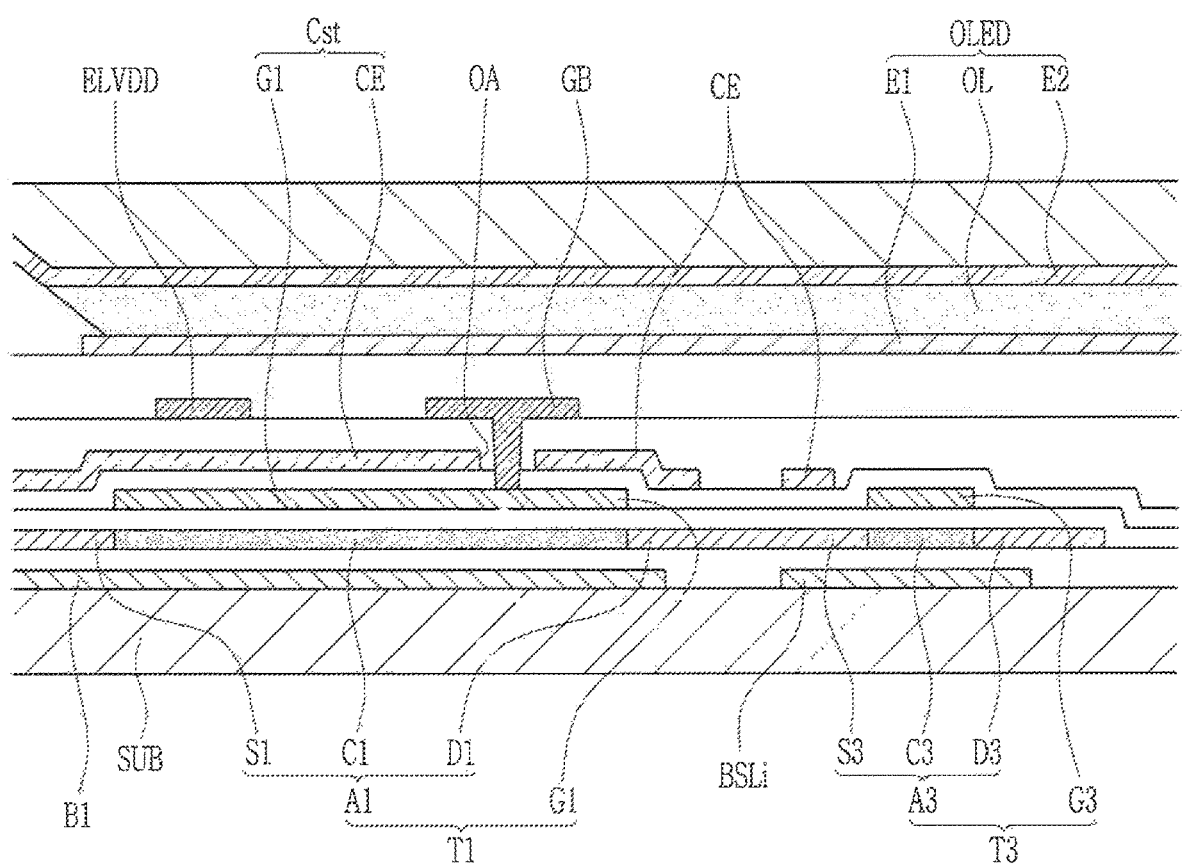
FIG. 5 shows a cross-sectional view with respect to a line V-V of FIG. 4A.

FIGS. 4A and 4B shows a layout view of one pixel of a display device according to an exemplary embodiment of the present invention, FIGS. 4C-4E are plan views illustrating layers of the pixel shown in FIG. 4A and FIG. 5 shows a cross-sectional view with respect to a line V-V of FIG. 4A.

As shown in FIGS. 4A-4E and FIG. 5, one pixel includes a pixel circuit including a first transistor TI, a second transistor T2, a third transistor T3, a fourth transistor T4, a fifth transistor T5, a sixth transistor T6, a seventh transistor T7, a capacitor Cst, and a gate bridge (GB) selectively connected to a first scan line (SLi), a first scan line (SLi-1), a second scan line (BSLi), an emission control line (EMi), a data line (DLj) a power voltage line (ELVDD), and an initialization voltage line (Vint), and an organic light emitting element (OLED) connected to the pixel circuit. The second scan line (BSLi) traverses the pixel circuit, and overlaps a first active pattern A1 of the first transistor T1 and a third active pattern A3 of the third transistor T3.

The first transistor T1 is provided on the substrate (SUB), and includes the first active pattern A1 and a first gate electrode G1.

The first active pattern A1 includes a first source electrode S1, a first channel C1, and a first drain electrode D1. The first source electrode S1 is connected to the second drain electrode D2 of the second transistor T2 and the fifth drain electrode D5 of the fifth transistor T5, and the first drain electrode D1 is connected to the third source electrode S3 of the third transistor T3 and the sixth source electrode S6 of the sixth transistor T6.

The first active pattern A1 may be made of a polysilicon or an oxide semiconductor. The oxide semiconductor may include one of oxides with titanium (Ti), hafnium (Hf), zirconium (Zr), aluminum (Al), tantalum (Ta), germanium (Ge), zinc (Zn), gallium (Ga), tin (Sn), or indium (In) as a base, and a complex oxide thereof such as a zinc oxide (ZnO), an indium-gallium-zinc oxide (In—Ga—Zn—O), a zinc-indium oxide (Zn—In—O), a zinc-tin oxide (Zn—Sn—O) an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), are indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), or a hafnium-indium-zinc oxide (Hf—In—Zn—O). When the first active pattern A1 is made of an oxide semiconductor, an additional passivation layer may be added to protect the oxide semiconductor that is weak in external environments such as a high temperature, The first channel C1 of the first active pattern A1 may be channel-doped with an N-type impurity or a P-type impurity, while the first source electrode S1 and the first drain electrode D1 may be separated from each other with the first channel C1 therebetween. The first source electrode S1_ and the first drain electrode D1 may be doped with an opposite type of doping impurity to the doping impurity doped to the first channel C1.

The first gate electrode G1 is provided on the first channel C1 of the first active pattern A1, and has an island shape. The first gate electrode G1 is connected to the fourth drain electrode D4 of the fourth transistor T4 and the third drain electrode D3 of the third transistor T3 by the gate bridge (GB) passing through a contact hole. The first gate electrode G1 overlaps the capacitor electrode (CE), and the first gate electrode G1 may simultaneously function as a gate electrode of the first transistor T1 and also as a first electrode of the capacitor Cst. In other words, the first gate electrode G1 forms a capacitor Cst together with a capacitor electrode (CE).

A bias electrode S1 is provided between the first active pattern A1 and the substrate (SUB). The first channel C1 of the first active pattern A1 overlaps the bias electrode B1. The bias electrode B1 extends from the second scan line (BSLi).

Charges such as electrons or holes are stored in the first channel C1 of the first active pattern A1 according to various levels of the second scan signal supplied to the second scan line (BSLi), so that a threshold voltage of the first transistor T1 is controlled.

In other words, the threshold voltage of the first transistor T1 may be increased or reduced by using the bias electrode B1, and hysteresis that may be generated by the first transistor T1 may be improved by controlling the threshold voltage of the first transistor T1.

The second transistor T2 is provided on the substrate (SUB), and includes a second active pattern A2 and a second gate electrode G2. The second active pattern A2 includes a second source electrode S2, a second channel C2, and a second drain electrode D2. The second source electrode S2 is connected to the data line (DLj) through a contact hole, and the second drain electrode D2 is connected to the first source electrode S1 of the first transistor T1. The second channel C2 that is a channel region of the second active pattern A2 overlapping the second gate electrode G2 is provided between the second source electrode S2 and the second drain electrode D2. In other words, the second active pattern A2 is connected to the first active pattern A1.

The second channel C2 of the second active pattern A2 may be channel doped with an N-type impurity or a P-type impurity, while the second source electrode S2 and the second drain electrode D2 are separated from each other with the first channel C1 therebetween. The second source electrode S2 and the second drain electrode D2 may be doped with an opposite type of doping impurity to the doping impurity doped to the first channel C1. The second active pattern A2 is provided on a same layer as the first active pattern A1, is formed of the same material as the first active pattern A1, and is integrally formed with the first active pattern A1.

The second gate electrode G2 is provided on the second channel C2 of the second active pattern A2, and is integrally formed with the first scan line (SLi).

The third transistor T3 is provided on the substrate (SUB), and includes a third active pattern A3 and a third gate electrode G3.

The third active pattern A3 includes a third source electrode S3, a third channel C3, and a third drain electrode D3. The third source electrode S3 is connected to the first drain electrode D1, and the third drain electrode D3 is connected to the first gate electrode of the first transistor T1 by the gate bridge (GB) passing through a contact hole. The third channel C3 that is a channel region of the third active pattern A3 overlapping the third gate electrode G3 is provided between the third source electrode S3 and the third drain electrode D3. In other words, the third active pattern A3 connects the first active pattern A1 and the first gate electrode G1.

The third channel C3 of the third active pattern A3 may be channel doped with an N-type impurity or a P-type impurity, while the third source electrode S3 and the third drain electrode D3 are separated from each other with the third channel C3 therebetween. In addition, the third source electrode S3 and the third drain electrode D3 may be doped with an opposite type of doping impurity to the doping impurity doped to the third channel C3. The third active pattern A3 is provided on a same layer as the first active pattern A1 and the second active pattern A2, is formed of the same material as the first active pattern A1 and the second active pattern A2, and is integrally formed with the first active pattern A1 and the second active pattern A2.

The third gate electrode G3 is provided on the third channel C3 of the third active pattern A3, and is integrally formed with the first scan line (SLi). The third gate electrode G3 is a dual gate electrode.

The fourth transistor T4 is provided on the substrate (SUB), and includes a fourth active pattern A4 and a fourth gate electrode G4.

The fourth active pattern A4 includes a fourth source electrode S4, a fourth channel C4, and a fourth drain electrode D4. The fourth source electrode S4 is connected to the initialization voltage line (Vint) through a contact hole, and the fourth drain electrode D4 is connected to the first gate electrode G1. of the first transistor T1 by the gate bridge (GB) passing through a contact hole. The fourth channel C4 that is a channel region of the fourth active pattern A4 overlapping the fourth gate electrode G4 is provided between the fourth source electrode S4 and the fourth drain electrode D4. In other words, the fourth active pattern A4 connects between the initialization voltage line (Vint) and the first gate electrode G1, and is connected to the third active pattern A3 and the first gate electrode G1.

The fourth channel C4 of the fourth active pattern A4 may be channel doped with an N-type impurity or a P-type impurity, while the fourth source electrode S4 and the fourth drain electrode D4 are separated from each other with the fourth channel C4 therebetween. In addition, the fourth source electrode S4 and the fourth drain electrode D4 may be doped with an opposite type of doping impurity to the doping impurity doped to the fourth channel C4. The fourth active pattern A4 is on a same layer as the first active pattern A1, the second active pattern A2, and the third active pattern A3, it is formed of the same material as the first active pattern A1, the second active pattern A2, and the third active pattern A3, and it is integrally formed with the first active pattern A1, the second active pattern A2, and the third active pattern A3.

The fourth gate electrode G4 is provided on the fourth channel C4 of the fourth active pattern A4, and is integrally formed with the first scan line (SLi-1). The fourth gate electrode G4 is a dual gate electrode.

The fifth transistor T5 is provided on the substrate (SUB), and includes a fifth active pattern A5 and a fifth gate electrode G5.

The fifth active pattern A5 includes a fifth source electrode S5, a fifth channel C5, and a fifth drain electrode D5. The fifth source electrode S5 is connected to the power voltage line (ELVDD) through a contact hole, and the fifth drain electrode D5 is connected to the first source electrode S1 of the first transistor T1. The fifth channel C5 that is a channel region of the fifth active pattern A5 overlapping the fifth gate electrode G5 is provided between the fifth source electrode S5 and the fifth drain electrode D5. in other words, the fifth active pattern A5 connects between the power voltage line (ELVDD) and the first active pattern A1.

The fifth channel C5 of the fifth active pattern A5 may be channel-doped with an N-type impurity or a P-type impurity, while the fifth source electrode S5 and the fifth drain electrode D5 may be separated from each other with the fifth channel C5 therebetween. In addition, the fifth source electrode S5 and the fifth drain electrode D5 may be doped with an opposite type of doping impurity to the doping impurity doped to the fifth channel C5. The fifth active pattern A5 is provided on a same layer as the first active pattern A1, the second active pattern A2, the third active pattern A3, and the fourth active pattern A4, it is formed of the same material as the first active pattern A1, the second active pattern A2, the third active pattern A3, and the fourth active pattern A4, and it is integrally formed with the first active pattern A1, the second active pattern A2, the third active pattern A3, and the fourth active pattern A4.

The fifth gate electrode G5 is provided on the fifth channel C5 of the fifth active pattern A5, and is integrally formed with the emission control line (EMi).

The sixth transistor T6 is provided on the substrate (SUB), and includes a sixth active pattern A6 and a sixth gate electrode G6.

The sixth active pattern A6 includes a sixth source electrode S6, a sixth channel C6, and a sixth drain electrode D6. The sixth source electrode S6 is connected to the first drain electrode D1 of the first transistor T1, and the sixth drain electrode D6 is connected to the first electrode E1 of the organic light emitting element (OLED) through a contact hole. The sixth channel C6 that is a channel region of the sixth active pattern A6 overlapping the sixth gate electrode G6 is provided between the sixth source electrode S6 and the sixth drain electrode D6. In other words, the sixth active pattern A6 connects between the first active pattern A1 and the first electrode E1 of the organic light emitting element (OLED).

The sixth channel C0 of the sixth active pattern A6 may be channel doped with an N-type impurity or a P-type impurity, while the sixth source electrode S6 and the sixth drain electrode D6 may be separated from each other with the sixth channel C6 therebetween. In addition, the sixth source electrode S6 and the sixth drain electrode D6 may be doped with an opposite type of doping impurity to the doping impurity doped to the sixth channel C6. The sixth active pattern A6 is provided on a same layer as the first active pattern A1, the second active pattern A2, the third active pattern A3, the fourth active pattern A4, and the fifth active pattern A5, it is formed with the same material as the first active pattern A1, the second active pattern A2, the third active pattern A3, the fourth active pattern A4, and the fifth active pattern A5, and it is integrally formed with the first active pattern A1, the second active pattern A2 the third active pattern A3, the fourth active pattern A4, and the fifth active pattern A5.

The sixth gate electrode G6 is provided on the sixth channel C6 of the sixth active pattern A6, and is integrally formed with the emission control line (EMi).

The seventh transistor T7 is provided on the substrate (SUB), and includes a seventh active pattern A7 and a seventh gate electrode G7.

The seventh active pattern A7 includes a seventh source electrode S7, a seventh charmed C7, and a seventh drain electrode D7. The seventh source electrode S7 is connected to a first electrode of an organic light emitting element of another pixel (e.g., another pixel provided at a bottom of the pixel shown in FIG. 4A), and the seventh drain electrode D7 is connected to the fourth source electrode S4 of the fourth transistor T4.

The seventh channel C7 that is a channel region of the seventh active pattern A7 overlapping the seventh gate electrode G7 is provided between the seventh source electrode S7 and the seventh drain electrode D7. In other words, the seventh active pattern A7 connects between the first electrode of the organic light emitting element of the another pixel and the fourth active pattern A4.

The seventh channel C7 of the seventh active pattern A7 may be channel-doped with an N-type impurity or a P-type impurity, while the seventh source electrode S7 and the seventh drain electrode D7 may be separated from each other with the seventh channel C7 therebetween. In addition, the seventh source electrode S7 and the seventh drain electrode D7 may be doped with an opposite type of doping impurity to the doping impurity doped to the seventh channel C7. The seventh active pattern A7 is on a same layer as the first active pattern A1, the second active pattern A2, the third active pattern A3, the fourth active pattern A4, the fifth active pattern A5, and the sixth active pattern A6, it is formed with the same material as the first active pattern A1, the second active pattern A2, the third active pattern A3, the fourth active pattern A4, the fifth active pattern A5, and the sixth active pattern A6, and it is integrally formed with the first active pattern A1, the second active pattern A2, the third active pattern A3, the fourth active pattern A4, the fifth active pattern A5, and the sixth active pattern A6.

The seventh gate electrode G7 is provided on the seventh channel C7 of the seventh active pattern A7, and is integrally formed with the first scan line (SU-1).

The first scan line (SLi) is provided on the second active pattern A2 and the third active pattern A3 and extends in a direction traversing the second active pattern A2 and the third active pattern A3. The first scan line (SU) is integrally formed with the second gate electrode G2 and the third gate electrode G3 and is connected to the second gate electrode G2 and the third gate electrode G3.

The first scan line SLi-1 is separated from the first scan line (SLi) and is provided on the fourth active pattern A4 and the seventh active pattern A7. The first scan line SLi-1 extends in a direction traversing the fourth active pattern A4 and the seventh active pattern A7, is integrally formed with the fourth gate electrode G4 and the seventh gate electrode G7 and is connected to the fourth gate electrode G4 and the seventh gate electrode G7.

The emission control line (EMi) is separated from the first scan line (SLi) and is provided on the fifth active pattern A5 and the sixth active pattern A6. The emission control line (EMi) extends in a direction traversing the fifth active pattern A5 and the sixth active pattern A6, is integrally formed with the fifth gate electrode G5 and the sixth gate electrode G6 and is connected to the fifth gate electrode G5 and the sixth gate electrode G6.

The above-described emission control line (EMi), the first scan line (SLi), the first scan line (SLi-1), the first gate electrode G1, the second gate electrode G2, the third gate electrode G3, the fourth gate electrode G4, the fifth gate electrode G5, the sixth gate electrode G6, and the seventh gate electrode G7 are provided on a same layer and are formed of the same material. In another exemplary embodiment of the present invention, the emission control line (EMi), the first scan line (SLi), the first scan line (SLi-1), the first gate electrode G1, the second gate electrode G2, the third gate electrode G3, the fourth gate electrode G4, the fifth gate electrode G5, the sixth gate electrode G6, and the seventh gate electrode G7 may be selectively provided on different layers and may be formed of different materials.

The capacitor Cst includes a first electrode and a second electrode facing each other with an insulating layer therebetween. The above-noted first electrode may be the capacitor electrode (CE), and the second electrode may be the first gate electrode G1. The capacitor electrode (CE) is provided on the first gate electrode G1, and is connected to the power voltage line (ELVDD) through a contact hole.

The capacitor electrode (CE) forms the capacitor Cst together with the first gate electrode G1, and the first gate electrode G1 and the capacitor electrode (CE) are formed with the same or a different metal on the different layers.

The capacitor electrode (CE) includes an opening (OA) overlapping part of the first gate electrode G1, and the gate bridge (GB) is connected to the first gate electrode G1 through the opening (OA). The capacitor electrode (CE) overlaps the second scan line (BSLi).

The data line (DLj) is provided on the first scan line (SLi), extends in a direction traversing the first scan line (SLi), and is connected to the second source electrode S2 of the second active pattern A2 through a contact hole. The data line (DLj) extends to traverse the first scan line (SLi), the first scan line (SLi-1), and the emission control line (EMi).

The power voltage line (ELVDD) is separated from the data line (DLj), is provided on the first scan line (SLi), extends in another direction traversing the first scan line (SLi), and is connected to the fifth source electrode S5 of the fifth active pattern A5 connected to the capacitor electrode (CE) and the first active pattern A1 through a contact hole. The power voltage line (ELVDD) extends to traverse the first scan line (SLi), the first scan line (SLi-1), and the emission control line (EMi).

The gate bridge (GB) is provided on the first scan line (SLi), is separated from the power voltage line (ELVDD), is connected to the third drain electrode D3 of the third active pattern A3 and the fourth drain electrode D4 of the fourth active pattern A4 through a contact hole, and is connected to the first gate electrode G1 exposed by the opening (OA) of the capacitor electrode (CE) through a contact hole.

The above-described data line (DLj), the power voltage line (ELVDD), and the gate bridge (GB) are provided on a same layer, and are formed of the same material. In another exemplary embodiment of the present invention, the data line (DLj), the power voltage line (ELVDD), and the gate bridge (GB) may be selectively provided on different layers and may be formed with different materials.

The initialization voltage line (Vint) is connected to the fourth source electrode S4 of the fourth active pattern A4 and the seventh drain electrode D7 of the seventh active pattern A7 through a contact hole. The initialization voltage line (Vint) is provided on a same layer as the first electrode E1 of the organic light emitting element (OLED) and is formed of the same material. In another exemplary embodiment of the present invention, the initialization voltage line (Vint) may be provided on a different layer from the first electrode E1 and may be formed of a different material.

The organic light emitting element (OLED) includes the first electrode E1, an organic emission layer OL, and a second electrode E2. The first electrode E1 is connected to the sixth drain electrode D6 of the sixth transistor T6 through a contact hole. The organic emission layer OL is provided between the first electrode E1 and the second electrode E2. The second electrode E2 is provided on the organic emission layer OL. At least one of the first electrode E1 and the second electrode E2 may be at least one of a light transmitting electrode, a light reflecting electrode, and a light semi-transmitting electrode. Light emitted by the organic emission layer OL, may be discharged in at least one direction of the first electrode E1 and the second electrode E2.

A capping layer for covering the organic light emitting element (OLED) may be provided on the organic light emitting element (OLED), and a thin film encapsulation layer or an encapsulation substrate may be provided on the organic light emitting element (OLED) with the capping layer therebetween.

The bias electrode B1 connected to the second scan line (BSLi) is shown to overlap the first active pattern A1 in FIGS. 4A, 4BC and FIG. 5. However, an additional bias electrode connected to the second scan line (BSLi) may overlap the third active pattern A3 and may be provided on a same layer as the bias electrode B1. In this case, the threshold voltage of the third transistor T3 may be controlled, so that the emission efficiency of the organic light emitting element (OLED) may be increased and an afterimage may be reduced.

The bias electrode B1 and the second scan line (BSLi) include a metal, without being limited thereto. For example, the bias electrode B1 and the second scan line (BSLi) may include other materials through which power is supplied, such as a conductive polymer.

As described, the bias electrode B1 to which a second scan signal is supplied overlaps the first active pattern A1 of the first transistor T1, so that the display device according to an exemplary embodiment of the present invention may control the threshold voltage of the first transistor T1. Therefore, the transistor characteristic of the first transistor T1 is improved. Therefore, emission efficiency of the organic light emitting element (OLED) connected to the first transistor T1 is improved.

For example, the first transistor T1 is a driving transistor connected to the organic light emitting element (OLED). Thus, the first transistor T1 substantially influences the current supplied to the organic light emitting element (PLED). The first channel C1 of the first active pattern A1 of the first transistor T1 overlaps the bias electrode B1, and charges such as electrons or holes are trapped in the first channel C1 of the first active pattern A1 according to the second scan signal supplied to the second scan line (BSLi) connected to the bias electrode B1. Therefore, the threshold voltage of the first transistor T1 can be controlled.

In other words, the threshold voltage of the first transistor T1 may be increased or reduced by using the second scan line (BSLi), and the hysteresis that may be generated to the first transistor T1 is improved by controlling the threshold voltage of the first transistor T1. As a consequence, emission efficiency of the organic light emitting element (OLED) connected to the first transistor T1 is improved.

In sum, the transistor characteristic of the first transistor T1 that is a driving transistor is improved by using the second scan line (BSLi), thereby providing the display device with the improved emission efficiency of the organic light emitting element (OLED).

The bias electrode B1 connected to the second scan line (BSLi) is shown to overlap the first active pattern A1 in FIG. 4 and FIG. 5, However, an additional bias electrode connected to the second scan line (BSLi) may overlap the third active pattern A3 and may be provided on a same layer as the bias electrode B1. In this case, the threshold voltage of the third transistor T3 may be controlled, so that the emission efficiency of the organic light emitting element (OLED) may be increased and an afterimage may be reduced.

A method for driving a display device will now be described with reference to FIG. 6 through FIG. 8.

Figure 6:
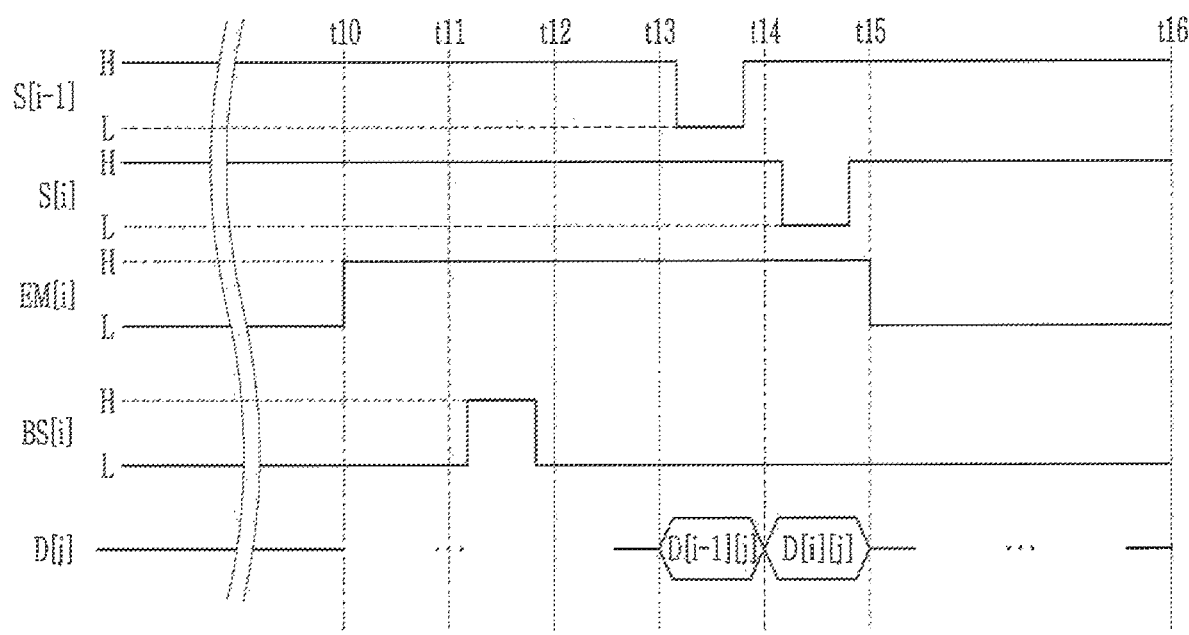
FIGS. 6, 7 and 8 show timing diagrams of a method for driving a display device according to exemplary embodiments of the present invention.
Figure 7:
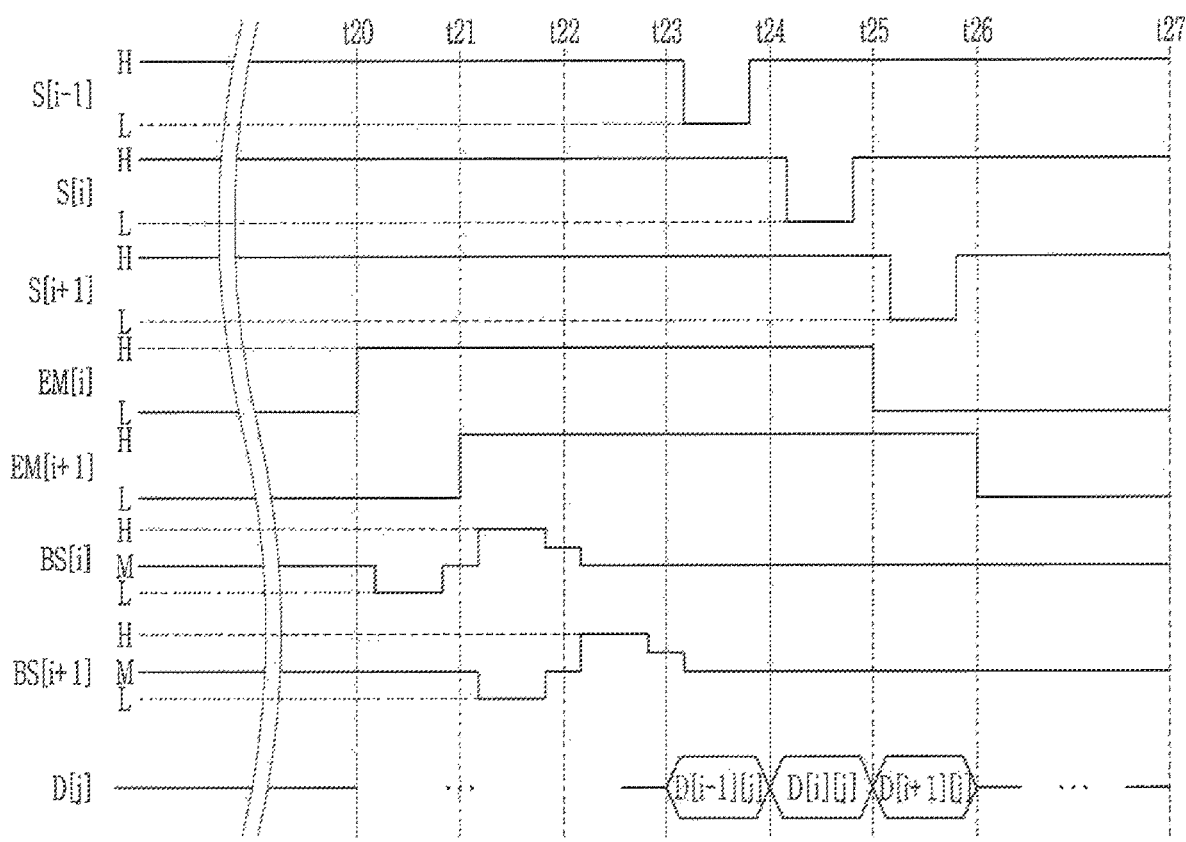
Figure 8:
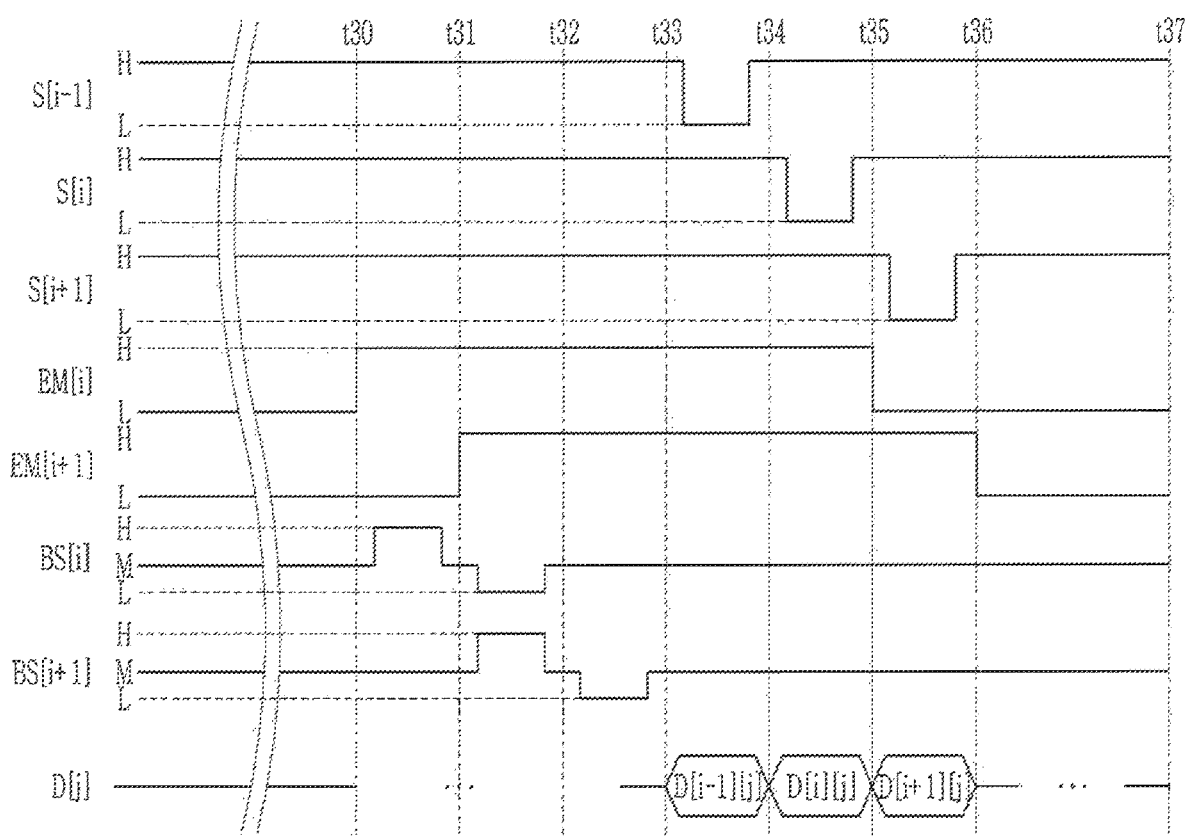

FIG. 6 through FIG. 8 show timing diagrams of a method for driving a display device according to exemplary embodiments of the present invention. A high level (H) is a level for disabling the transistors T1 through T7 in the pixel PX, and a medium level (M) and a low level (L) are levels for enabling the transistors T1 through T7 in the pixel PX.

First, as shown in FIG. 6, when an emission control signal (EM[i]) supplied to the emission control line (EMi) is changed to the high level (H) at t10, an emission of the pixels PX connected to the emission control line (EMi) finishes. In other words, the pixels PX connected to the emission control line (EMi) stop emitting light.

For a period from t10 to t11, a second scan signal (BS[i]) applied to the second scan line (BSLi) has a low level (L). Here, the low level (L) of the second scan signal (BS[i]) may have a voltage that is equal to or less than the low level (L) of a first scan signal (S[i]). After the emission of the pixels PX finishes, charges such as electrons or holes are trapped on an interface of the channel C1 of the active pattern A1 of the first transistor T1 or an interface on another layer contacting the active pattern A1 overlapping the bias electrode B1 connected to the second scan line (BSLi) by the low-level (L) second scan signal (BS[i]). Before an operation of programming a data signal at a hysteresis deviation among the first transistors T1 of the pixels connected to the first scan line (SLi) may be reduced.

For a period from t11 to t12, the second scan signal (BS[i]) applied to the second scan line (BSLi) has a high level (H). Charges such as electrons or holes trapped on an interface of the channel C1 of the active pattern A1 of the first transistor T1 or an interface on another layer contacting the active pattern A1 overlapping the bias electrode B1 connected to the second scan line (BSLi) are removed by the high-level (H) second scan signal (BS[i]). Therefore, the current passing through an active pattern may quickly pass through the active pattern without interference by the trapped holes, thereby reducing afterimages and flickers.

For a period from t12 to t13, the second scan signal (BS[i]) applied to the second scan line (BSLi) has a low level (L).

A driving range of a gate-source voltage (Vgs) between the gate electrode G1 and the source electrode S1 of the first transistor T1 may increase by the low-level (L) second scan signal (BS[i]). The driving range of the gate-source voltage (Vgs) is wide, so that grays of light emitted by the organic light emitting element (OLED) may be more precisely controlled by changing the size of the gate-source voltage (Vgs). As a result, a resolution of the display device may be increased and a display quality of the display device may be improved.

The low level (L) of the second scan signal (BS[i]) applied for the period from t12 to t13 is illustrated to be equivalent to the low level (L) of the second scan signal (BS[i]) applied for the period from t10 to t11, but the low level (L) of the second scan signal (BS[i]) applied for the period from t12 to t13 may be greater than the low level (L) of the second scan signal (BS[i]) applied for the period from t10 to t11.

For a period from t13 to t14, the first scan signal (S[i-1]) applied to the first scan line (SLi-1) has a low level (L). For example, the first scan signal (S[i-1]) applied to the first scan line (SLi-1) may transition from the high level (H) to the low level (L) during the period from t13 to t14. The fourth transistor T4 and the seventh transistor T7 are turned on by the low-level (L) first scan signal (S[i-1]). The first node N1 may be initialized with the initialization voltage (Vint) by the turned-on fourth transistor T4. An anode of the organic light emitting element (OLED) may be initialized with the initialization voltage (Vint) by the turned-on seventh transistor T7.

For a period from t14 to t15, the first scan signal (S[i]) applied to the first scan line (SLi) has a low level (L). For example, the first scan signal (S[i]) applied to the first scan line (SLi) may transition from the high level (H) to the low level (L) during the period from t14 to t15. The second transistor T2 and the third transistor T3 are turned on by the low-level (L) first scan signal (S[i]). In this case, a corresponding data signal (D[j]) is applied through the data line (DLj). A compensation voltage generated by reducing a data voltage (D[i][j]) by the threshold voltage of the first transistor T1 is transmitted to the first node N1 through the turned-on second transistor T2 and the turned-on third transistor T3. Charges corresponding to a voltage difference between the compensation voltage and the power voltage (ELVDD) applied to respective ends of the capacitor Cst may be stored in the capacitor Cst. In the period from t13 to t14, a previous data voltage is denoted by (D[i-1][j]).

For a period after t15, the emission control signal (EM[i]) applied to the emission control line (EMi) has a low level (L). The fifth transistor T5 and the sixth transistor T6 are turned on by the low-level (L) emission control signal (EM[i]). A driving current caused by a voltage difference between the gate voltage (Vg) at the gate electrode G1 of the first transistor T1 and the driving voltage (ELVDD) is generated, and the driving current may be supplied to the organic light emitting element (OLED) through the sixth transistor T6.

When the first transistor T1 is turned on, the charges move through the active pattern A1 of the first transistor T1. In this process, some holes are led by a potential of the gate electrode G1 of the first transistor T1 and are trapped on the interface of the active pattern A1. Since a turn-on period of the first transistor T1 increases and intensity of the current increases, many more holes may be trapped. The trapped holes may not allow a fluent flow of charges, such that a luminance expressed by the display device may not be appropriately realized. Therefore, image distortion may be generated for each frame period, and image defects such as afterimages may be resultantly generated.

The exemplary embodiments of the present invention apply the low-level (L) second scan signal (BS[i]( after emission is finished to thus trap the charges on an interface of the channel C1 of the active pattern A1 of the first transistor T1 of the pixels PX or an interface of another layer contacting the active pattern A1. In other words, the second scan signal (BS[i]) is applied so that the first transistors T1 of all the pixels PX connected to the second scan line (BSLi) may store the charges. This way, hysteresis deviation among the first transistors T1 of the pixels PX connected to the second scan line (BSLi) may be reduced. By applying the high-level (H) second scan signal (BS[i]), charges of the electrons or the holes trapped on the interface of the channel C1 of the active pattern A1 of the first transistor T1 of the pixels PX connected to the second scan line (BSLi) or the interface of another layer contacting the active pattern A1 are removed. In other words, the charges are released. Therefore, the current passing through an active pattern may quickly pass through the active pattern without interference of trapped holes, thereby reducing afterimages and flickers. The low-level (L) second scan signal (BS[i]) is applied again, and the driving range of the gate-source voltage (Vgs) between the gate electrode G1 and the source electrode S1 of the first transistors T1 of the pixels PX connected to the second scan line (BSLi) may be increased. The driving range of the gate-source voltage (Vgs) is wide, so that grays of light emitted by the organic light emitting element (OLED) may be more precisely controlled by changing the size of the gate-source voltage (Vgs). As a result, resolution of the display device may be increased and display quality of the display device may be improved.

As shown in FIG. 7, when the emission control signal (EM[i]) supplied to the emission control line (EMi) changes to a high level (H) at t20, emission of the pixels PX connected to the emission control line (EMi) finishes.

For a period from t20 to t21, the second scan signal (BS[i]) applied to the second scan line (BSLi) has a low level (L). Here, the low level (L) of the second scan signal (BS[i]) may have a voltage that is equal to or less than the low level (L) of the first scan signal (S[i]). After emission finishes, charges such as electrons or holes are trapped on an interface of the channel C1 of the active pattern A1 of the first transistor T1 or an interface on another layer contacting the active pattern A1 overlapping the bias electrode B1 connected to the second scan line (BSLi) by the low-level (L) second scan signal (BS[i]). Before an operation of programming a data signal at t24, a hysteresis deviation among the first transistors T1 of the pixels PX connected to the first scan line (SLi) may be reduced.

For a period from t21 to t22, the second scan signal (BS[i]) applied to the second scan line (BSLi) has a high level (H). In this period, the second scan signal (BS[i]) transitions from the medium level (M) to the high level (H). Charges such as electrons or holes trapped on an interface of the channel C1 of the active pattern A1. of the first transistor T1 or an interface on another layer contacting the active pattern A1, overlapping the bias electrode E1 connected to the second scan line (BSLi), are removed by the high-level (H) second scan signal (BS[i]). Therefore, the current passing through an active pattern may quickly pass through the active pattern without interference by the trapped holes, thereby reducing afterimages and flickers.

For a period from t22 to t23, the second scan signal (BS[i]) applied to the second scan line (BSLi) has a medium level (M). For example, the second scan signal (BS[i]) may decrease in a stepwise fashion from the high level (H) prior to t22 to the medium level (M) after t22.

A driving range of a gate-source voltage (Vgs) between the gate electrode G1 and the source electrode S1 of the first transistor T1 may increase by the medium-level (M) second scan signal (BS[i]). The driving range of the gate-source voltage (Vgs) is wide, so grays of light emitted by the organic light emitting element (OLED) may be more precisely controlled by changing the size of the gate-source voltage (Vgs). As a result, resolution of the display device may be increased and display quality of the display device may be improved.

For a period from t23 to t24, the first scan signal (S[i-1]) applied to the first scan line (SLi-1) has a low level (L). The fourth transistor T4 and the seventh transistor T7 are turned on by the low-level (L) first scan signal (S[i-1]). The first node N1 may be initialized with the initialization voltage (Vint) by the turned-on fourth transistor T4. The anode of the organic light emitting element (OLED) may be initialized with the initialization voltage (Vint) by the turned-on seventh transistor T7.

For a period from t24 to t25, the first scan signal (S[i]) applied to the first scan line (SLi) has a low level (L). The second transistor T2 and the third transistor T3 are turned on by the low-level (L) first scan signal (S[i]). In this case, a corresponding data signal (D[j]) is applied through the data line (DLj). A compensation voltage generated by reducing a data voltage (D[i][j]) by the threshold voltage of the first transistor T1 is transmitted to the first node N1 through the turned-on second transistor T2 and the turned-on third transistor T3. Charges corresponding to a voltage difference between the compensation voltage and the power voltage (ELVDD) applied to respective ends of the capacitor Cst may be stored in the capacitor Cst.

For a period after t25, the emission control signal (EM[i]) applied to the emission control line (EMi) has a low level (t). The fifth transistor T5 and the sixth transistor T6 are turned on by the low-level (L) emission control signal (EM[i]). A driving current caused by the voltage difference between the gate voltage (Vg) at the gate electrode G1 of the first transistor T1 and the driving voltage (ELVDD) may be generated, and a driving current may be supplied to the organic light emitting element (OLED) through the sixth transistor T6. In the period from t25 to t26, a next data voltage is denoted by (D[i+1][j]).

When the first transistor is turned on, charges move through the active pattern A1 of the first transistor T1. In this process, some holes are led by a potential of the gate electrode G1 of the first transistor T1 and are trapped on the interface of the active pattern A1. As a turn-on period of the first transistor T1 increases and intensity of the current increases, many more holes may be trapped. The trapped holes may not allow a fluent flow of charges, such that a luminance expressed by the display device may not be appropriately realized. Therefore, image distortion may be generated for each frame period, and image defects such as afterimages may be generated.

The exemplary embodiments of the present invention apply the lo level (L) second scan signal (BS[i]) after emission is finished to thus trap the charges on an interface of the channel C1 of the active pattern A1 of the first transistor T1 of the pixels PX or an interface of another layer contacting the active pattern A1. in other words, the second scan signal (BS[i]) is applied so that the first transistors of all the pixels PX connected to the second scan line (BSLi) may store the charges. This way, a hysteresis deviation among the first transistor T1. of the pixels PX connected to the second scan line (BSLi) may be reduced. By applying the high-level (H) second scan signal (BS[i]), charges of the electrons or the holes trapped on the interface of the channel C1 of the active pattern A1 of the first transistor T1 of the pixels PX connected to the second scan line (BSLi) or the interface of another layer contacting the active pattern A1 are removed. Therefore, the current passing through an active pattern may quickly pass through the active pattern without interference of trapped holes, thereby reducing afterimages and flickers. The medium-level (M) second scan signal (BS[i]) is applied again, and the driving range of the gate-source voltage (Vgs) between the gate electrodes G1 and the source electrodes S1 of the first transistors T1 of the pixels PX connected to the second scan line (BSLi) may be increased. The driving range of the gate-source voltage (Vgs) is wide, so grays of light emitted by the organic light emitting element (OLED) may be more precisely controlled by changing the size of the gate-source voltage (Vgs). As a result, resolution of the display device may be increased and display quality of the display device may be improved.

As shown in FIG. 8, when the emission control signal (EM[i]) supplied to the emission control line (EMi) changes to a high level (H) at t30, the pixels PX connected to the emission control line (EMi) finish emitting light.

For a period from t30 to t31, the second scan signal (BS[i]) applied to the second scan line (BSLi) has a high level (H). Charges such as electrons or holes trapped on an interface of the channel C1 of the active pattern A1 of the first transistor T1 or an interface on another layer contacting the active pattern A1, overlapping the bias electrode B1 connected to the second scan line (BSLi), are removed by the high-level (H) second scan signal (BS[i]). Therefore, the current passing through an active pattern may quickly pass through the active pattern without interference by the trapped holes, thereby reducing afterimages and flickers.

For a period from t31 to t32, the second scan signal (BS[i]) applied to the second scan line (BSLi) has a low level (L). Here, the low level (L) of the second scan signal (BS[i]) may have a voltage that is equal to or less than the low level (L) of the first scan signal (S[i]). After emission finishes, charges such as electrons or holes are trapped on an interface of the channel C1 of the active pattern A1 of the first transistor T1 or an interface on another layer contacting the active pattern A1, overlapping the bias electrode B1 connected to the second scan line (BSLi) by the low-level (L) second scan signal (BS[i]). Before an operation of programming a data signal at t34, a hysteresis deviation among the first transistors T1 of the pixels PX connected to the first scan line (SLi) may be reduced.

For a period from t32 to t33, the second scan signal (BS[i]) applied to the second scan line (BSLi) has a medium level (M).

A driving range of a gate-source voltage (Vgs) between the gate electrode G1 and the source electrode S1 of the first transistor T1 may increase by the medium-level (M) second scan signal (BS[i]). The driving range of the gate-source voltage (Vgs) is wide, so that grays of light emitted by the organic light emitting element (OLED) may be more precisely controlled by changing the size of the gate-source voltage (Vgs). As a result, resolution of the display device may be increased and display quality of the display device may be improved.

In another exemplary embodiment of the present invention, for a period from t32 to t33, the second scan signal (BS[i]) applied to the second scan line (BSLi) may be maintained at a low level (L). In this case, the driving range of the gate-source voltage (Vgs) between the gate electrode G1 and the source electrode S1 of the first transistor T1 may increase by the low-level (L) second scan signal (BS[i]).

For a period from t33 to t34, the first scan signal (S[i-1]) applied to the first scan line (SLi-1) has a low level (L). The fourth transistor T4 and the seventh transistor T7 are turned on by the low-level (L) first scan signal (S[i-1]). The first node N1 may be initialized with the initialization voltage (Vint) by the turned-on fourth transistor T4. In addition, the anode of the organic light emitting element (OLED) may be initialized with the initialization voltage (Vint) by the turned-on seventh transistor T7.

For a period from t34 to t35, the first scan signal (S[i]) applied to the first scan line (SLi) has a low level (L). The second transistor T2 and the third transistor T3 are turned on by the low-level (L) first scan signal (S[i]). In this case, a corresponding data signal (D[j]) is applied through the data line (DLj). A compensation voltage generated by reducing the data voltage (D[i][j]) by the threshold voltage of the first transistor T1 is transmitted to the first node N1 through the turned-on second transistor T2 and the turned-on third transistor T3. Charges corresponding to a voltage difference between the compensation voltage and the power voltage (ELVDD) applied to respective ends of the capacitor Cst may be stored in the capacitor Cst.

For a period after t35, the emission control signal (EM[i]) applied to the emission control line (EMi) has a low level (L). The fifth transistor T5 and the sixth transistor T6 are turned on by the low-level (L) emission control signal (EM[i]). The driving current caused by the voltage difference between the gate voltage (Vg) at the gate electrode G1 of the first transistor T1 and the driving voltage (ELVDD) is generated, and the driving current may be supplied to the organic light emitting element (OLED) through the sixth transistor T6.

When the first transistor T1 is turned on, the charges move through the active pattern A1 of the first transistor T1. In this process, some holes are led by a potential of the gate electrode G1 of the first transistor T1 and are trapped on the interface of the active pattern A1. As a turn-on period of the first transistor T1 increases and intensity of the current increases, many more holes may be trapped. The trapped holes may not allow a fluent flow of charges, so that a luminance expressed by the display device may not be appropriately realized. Therefore, image distortion may be generated for each frame period, and image defects such as afterimages may be generated.

The exemplary embodiments of the present invention apply the low-level (L) second scan signal (BS[i]) after emission is finished to thus trap the charges on an interface of the channel C1 of the active pattern A1 of the first transistor T1 of the pixels PX or an interface of another layer contacting the active pattern A1. In other words, the second scan signal (BS[i]) is applied so that the first transistors T1 of all the pixels PX connected to the second scan line (BSLi) may store the charges. This way, a hysteresis deviation among the first transistors T1 of the pixels connected to the second scan line (BSLi) may be reduced. By applying the high-level (H) second scan signal (BS[i]), charges of the electrons or the holes trapped on the interface of the channel C1 of the active pattern A1 of the first transistor T1 of the pixels PX connected to the second scan line (BSLi) or the interface of another layer contacting the active pattern A1 are removed. Therefore, the current passing through an active pattern may quickly pass through the active pattern without interference of trapped holes, thereby reducing afterimages and flickers. The medium-level (M) second scan signal (BS[i]) is applied again, and the driving range of the gate-source voltage (Vgs) between the gate electrode G1 and the source electrode S1 of the first transistors T1 of the pixels PX connected to the second scan line (BSLi) may be increased. The driving range of the gate-source voltage (Vgs) is wide, so that grays of light emitted by the organic light emitting element (OLED) may be more precisely controlled by changing the size of the gate-source voltage (Vgs). As a result, resolution of the display device may be increased and display quality of the display device may be improved.

Exemplary embodiments of the present invention can reduce hysteresis of a transistor in a pixel. In addition, exemplary embodiments of the present invention can refresh trapped charges according to degradation of an interface of an active layer of a transistor in a pixel and a gate insulating layer or an active layer and a buffer layer. Further, exemplary embodiments of the present invention can reduce a characteristic difference among transistors of pixels.

For example, the display device and driving method according to the exemplary embodiments of the present invention reduce an instant afterimage effect that may be generated by different luminances of pixels displaying the same gray. In addition, the display device and driving method according to the exemplary embodiments of the present invention improve a response speed deteriorating effect caused by a hysteresis phenomenon. Further, the display device and driving method according to the exemplary embodiments of the present invention, reduce a stained display that is caused by a characteristic difference among transistors.

While this invention has been particularly shown and described with reference to exemplary embodiments thereof, it is to be understood by those skilled in the art that various modifications may be made thereto without departing from the spirit and scope of the present invention as defined by the appended claims.

What is claimed is:
1. A display device, comprising:
 a substrate;
 a plurality of organic light emitting elements provided on the substrate;
 a plurality of pixel circuits, at least one of the pixel circuits including a first transistor including a first active pattern and a first gate electrode disposed on the first active pattern, a second transistor including a second active pattern connected to the first active pattern, wherein the second transistor includes a second gate electrode, and a third transistor including a third active pattern including a third channel connecting the first active pattern and the first gate electrode, wherein the third transistor includes a third gate electrode;
 a first scan line, traversing the plurality of pixel circuits and connected to the second gate electrode and the third gate electrode;
 a data line disposed on the first scan line, traversing the first scan line and connected to the second active pattern, and a second scan line traversing the plurality of pixel circuits and connected to a bias electrode overlapping the first active pattern, wherein the first transistor is reverse biased by a second scan signal applied to the second scan line connected to the bias electrode.

2. The display device of claim 1, wherein
the bias electrode is disposed between the substrate and the first active pattern.

3. The display device of claim 2, wherein
the second scan line is disposed between the substrate and the first third active pattern.

4. The display device of claim 1, wherein
the at least one pixel circuit includes a capacitor electrode overlapping the first gate electrode and forming a capacitor with the first gate electrode, and
the bias electrode overlaps the capacitor electrode.

5. The display device of claim 1, wherein
the at least one pixel circuit further includes a capacitor electrode overlapping the third active pattern.

6. The display device of claim 1, wherein
the at least one pixel circuit further includes:
a fourth transistor including a fourth active pattern connected to the first gate electrode and the third active pattern, wherein the fourth transistor includes a fourth gate electrode, and a seventh transistor including a seventh active pattern connected to the fourth active pattern, wherein the seventh transistor includes a seventh gate electrode, wherein the display device further includes:

a third scan line connected to the fourth gate electrode and the seventh gate electrode, a power voltage line disposed on the first scan line, separated from the data line, traversing the first scan line and connected to the first active pattern, and an initialization voltage line connected to the fourth active pattern and the seventh active pattern.

7. The display device of claim 6, wherein
the at least one pixel circuit further includes:
a fifth transistor including a fifth active pattern connecting the first active pattern and the power voltage line, wherein the fifth transistor includes a fifth gate electrode, and a sixth transistor including a sixth active pattern connecting the first active pattern and the organic light emitting element, wherein the sixth transistor includes a sixth gate electrode, wherein the display device further includes:

an emission control line connected to the fifth gate electrode and the sixth gate electrode.

* * * * *